(12) United States Patent
Schricker et al.

(10) Patent No.: US 8,236,623 B2
(45) Date of Patent: *Aug. 7, 2012

(54) MEMORY CELL THAT EMPLOYS A SELECTIVELY FABRICATED CARBON NANO-TUBE REVERSIBLE RESISTANCE-SWITCHING ELEMENT AND METHODS OF FORMING THE SAME

(75) Inventors: April Schricker, Fremont, CA (US); Mark Clark, Santa Clara, CA (US); Brad Herner, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 939 days.

This patent is subject to a terminal disclaimer.

(21) Appl. No.: 11/968,154

(22) Filed: Dec. 31, 2007

(65) Prior Publication Data

US 2009/0168491 A1 Jul. 2, 2009

(51) Int. Cl.
*H01L 21/332* (2006.01)
(52) U.S. Cl. ........ 438/133; 438/139; 438/381; 438/382; 257/107; 257/E27.004; 257/E27.035; 257/E29.022; 365/100; 365/105
(58) Field of Classification Search ................ 438/138, 438/139, 381, 382; 257/107, E27.004, E27.009, 257/E27.035, E29.022, E51.04; 977/707, 977/708, 712, 720, 721, 742, 749; 365/69, 365/71, 100, 103, 105
See application file for complete search history.

(56) References Cited

U.S. PATENT DOCUMENTS

| 5,854,102 | A | 12/1998 | Gonzalez et al. |
|---|---|---|---|
| 5,915,167 | A | 6/1999 | Leedy |
| 6,034,882 | A | 3/2000 | Johnson et al. |
| 6,706,402 | B2 | 3/2004 | Rueckes et al. |
| 6,858,481 | B2 | 2/2005 | Krieger et al. |
| 6,946,719 | B2 | 9/2005 | Petti et al. |
| 6,952,030 | B2 | 10/2005 | Herner |
| 7,176,064 | B2 | 2/2007 | Herner |
| 7,208,372 | B2 | 4/2007 | Hsu et al. |
| 7,286,388 | B1 | 10/2007 | Chen et al. |
| 7,385,266 | B2 * | 6/2008 | Segal et al. .......... 257/414 |
| 7,405,465 | B2 | 7/2008 | Herner |
| 7,575,984 | B2 | 8/2009 | Radigan |
| 7,638,383 | B2 | 12/2009 | Jin et al. |
| 2004/0160812 | A1 | 8/2004 | Rinerson et al. |
| 2006/0214183 | A1 | 9/2006 | Gaun et al. |
| 2006/0250836 | A1 | 11/2006 | Herner |

(Continued)

FOREIGN PATENT DOCUMENTS

EP 1 796 103 6/2007

(Continued)

OTHER PUBLICATIONS

Supplementary European Search Report & Written Opinion of EP Application No. 08869555.6 dated Nov. 11, 2010.

(Continued)

*Primary Examiner* — Julio J Maldonado
*Assistant Examiner* — Daniel Shook
(74) *Attorney, Agent, or Firm* — Dugan & Dugan, PC

(57) ABSTRACT

In some aspects, a method of fabricating a memory cell is provided that includes (1) fabricating a steering element above a substrate; and (2) fabricating a reversible-resistance switching element coupled to the steering element by selectively fabricating carbon nano-tube (CNT) material above the substrate. Numerous other aspects are provided.

61 Claims, 11 Drawing Sheets

U.S. PATENT DOCUMENTS

| | | | |
|---|---|---|---|
| 2006/0268594 A1 | 11/2006 | Toda | |
| 2007/0018228 A1 | 1/2007 | Sandhu et al. | |
| 2007/0037414 A1 | 2/2007 | Yamauchi et al. | |
| 2007/0103963 A1 | 5/2007 | Kim et al. | |
| 2007/0132049 A1 | 6/2007 | Stipe | |
| 2007/0133266 A1 | 6/2007 | Furukawa et al. | |
| 2007/0158697 A1 | 7/2007 | Choi et al. | |
| 2007/0190722 A1 | 8/2007 | Herner | |
| 2007/0238319 A1 | 10/2007 | Jewell-Larsen et al. | |
| 2008/0070162 A1 | 3/2008 | Ufert | |
| 2008/0157257 A1* | 7/2008 | Bertin et al. | 257/476 |
| 2008/0165574 A1 | 7/2008 | Kim et al. | |
| 2008/0182408 A1 | 7/2008 | Lee et al. | |
| 2009/0001343 A1 | 1/2009 | Schricker et al. | |
| 2009/0001345 A1 | 1/2009 | Schricker et al. | |
| 2009/0166609 A1 | 7/2009 | Schricker et al. | |
| 2009/0166610 A1 | 7/2009 | Schricker et al. | |

FOREIGN PATENT DOCUMENTS

| | | |
|---|---|---|
| EP | 1 892 722 | 2/2008 |
| WO | WO 2006-061599 | 6/2006 |
| WO | WO 2006/102391 A2 | 9/2006 |
| WO | WO 2006-122111 A2 | 11/2006 |
| WO | WO 2006-133949 | 12/2006 |
| WO | WO 2008-021900 | 2/2008 |

OTHER PUBLICATIONS

Communication pursuant to Rules 70(2) and 70a(2) EPC of European Patent Application No. 08869555.6 dtd Dec. 23, 2010.

Ago et al., "Workfunction of Purified and Oxidised Carbon Nanotubes," Synthetic Metals, vol. 103, pp. 2494-2495 (1999).

Jun. 22, 2011 Reply to the Dec. 23, 2010 Communication pursuant to Rules 70(2) and 70a(2) EPC of related European Patent Application No. 08869555.6.

Subramanian et al., "High-Performance Germanium-Seeded Laterally Crystallized TFTs for Vertical Device Integration," Electron Devices, IEEE Transactions; Publication Date: Sep. 1998, vol. 45, Issue 9, pp. 1934-1939.

Schricker et al., U.S. Appl. No. 13/235,409 (SD-MXA-241-1) filed Sep. 18, 2011.

Communication pursuant to Article 94(3) EPC in related European Patent Application No. 08869555.6 (SD-MXA-241-EP) dated Aug. 26, 2011.

Schricker, U.S. Appl. No. 12/410,789 (SD-MXA-256-US) filed Mar. 25, 2009.

Schricker, U.S. Appl. No, 12/410,789 (SD-MXA-370-US) filed Mar. 25, 2009.

Abdi et al., "PECVD-Grown Carbon Nanotubes on Silicon Substrates with a Nickel-Seeded Tip-Growth Structure", Science Direct—Materials Science and Engineering C 26 (2006), pp. 1219-1223.

Choi et al., "Ultrahigh-density Nanotransistors by using Selectively Grown Vertical Carbon Nanotubes", Nov. 26, 2001, Applied Physics Letters, vol. 79, No. 22, pp. 3696-3698.

Hemer et al., "Polysilicon Memory Switching: Electrothermal-Induced Order", Sep. 2006, IEEE Transactions on Electron Devices, vol. 53, No. 9, pp. 2320-2327.

Hemer et al., "Vertical p-i-n. Polysilicon Diode With Antifuse for Stackable Field-Programmable ROM", May 2004, IEEE Electron Device Letters, vol. 25, No. 5, pp. 271-273.

Li et al., "Bottom-up Approach for Carbon Nanotube Interconnects", Apr. 14, 2003, Applied Physics Letters, vol. 82, No. 15, pp. 2491-2493.

Malhi et al., "Characteristics and three-dimensional intergration of MOSFETs in small grain LPCVD polysilicon,"IEEE J. Solid State Circuits, vol. SSC-20, pp. 178-201, Feb. 1985.

Meyyappan et al., "Carbon Nanotube Growth by PECVD: a Review", Plasma Sources Sci. Technol. 12 (2003), pp. 205-216.

Nozaki et al., "Fabrication of Vertically Aligned Single-Walled Carbon Nanotubes in Atmospheric Pressure Non-Thermal Plasma CVD", 2006, Science Direct—Carbon 45 (2007), pp. 364-374.

Rao et al., "In Situ-Grown Carbon Nanotube Array with Excellent Field Emission Characteristics", Jun. 19, 2000, Applied Physics Letters, vol. 76, No. 25, pp. 3813-3815.

Shin et al., "Influence of Morphology of Catalyst Thin Film on Vertically Aligned Carbon Nanotube Growth", Science Direct—Journal of Crystal Growth 271 (2004), pp. 81-89.

Smith et al., "Polishing TiN for Nanotube Synthesis", Nov. 2001, Proceedings of the 16th Annual Meeting of the American Society for Precision Engineering, pp. 1-4.

Son et al., "Electrical Switching in Metallic Carbon Nanotubes", Physical Review Letters, vol. 95, Issue 21. ID 216602, 2005.

Srivastava et al., "Carbon Nanotube Interconnects: Implications for Performance, Power Dissipation and Thermal Management", 2005, IEEE, pp. 1-4.

Uchino et al., "Catalyst Free Low Temperature Direct Growth of Carbon Nanotubes", Jul. 2005, Proceedings of 2005 5th IEEE Conference on Nanotechnology, pp. 1-4.

International Search Report and Written Opinion of International Application No. PCT/US2008/088564 (SD-MXA-241-PCT) mailed Jul. 23, 2009.

Jang, J.E. et al. "Nanoelectromechanical switches with vertically aligned carbon nanotubes", Applied Physics Letters, vol. 87, (2005) pp. 163114-1 - 163114-3.

Feb. 24, 2012 Response to Aug. 26, 2011 Communication pursuant to Article 94(3) EPC in related European Patent Application No. 08869555.6 (SD-MXA-241-EP).

* cited by examiner

MEMORY CELL THAT EMPLOYS A SELECTIVELY FABRICATED CARBON NANO-TUBE REVERSIBLE RESISTANCE-SWITCHING ELEMENT AND METHODS OF FORMING THE SAME

CROSS REFERENCE TO RELATED APPLICATIONS

The present application is related to the following patent applications, each of which is hereby incorporated by reference herein in its entirety for all purposes:

U.S. patent application Ser. No. 11/968,156, filed 31 Dec. 2007, and titled "MEMORY CELL THAT EMPLOYS A SELECTIVELY FABRICATED CARBON NANO-TUBE REVERSIBLE RESISTANCE-SWITCHING ELEMENT FORMED ON A BOTTOM CONDUCTOR AND METHODS OF FORMING THE SAME."

U.S. patent application Ser. No. 11/968,159, filed 31 Dec. 2007, and titled "MEMORY CELL WITH PLANARIZED CARBON NANOTUBE LAYER AND METHODS OF FORMING THE SAME."

FIELD OF THE INVENTION

The present invention relates to non-volatile memories and more particularly to a memory cell that employs a selectively fabricated carbon nano-tube (CNT) reversible resistance-switching element and methods of forming the same.

BACKGROUND OF THE INVENTION

Non-volatile memories formed from reversible resistance-switching elements are known. For example, U.S. patent application Ser. No. 11/125,939, filed May 9, 2005 and titled "REWRITEABLE MEMORY CELL COMPRISING A DIODE AND A RESISTANCE-SWITCHING MATERIAL" (hereinafter "the '939 Application"), which is hereby incorporated by reference herein in its entirety, describes a rewriteable non-volatile memory cell that includes a diode coupled in series with a reversible resistivity-switching material such as a metal oxide or metal nitride.

However, fabricating memory devices from rewriteable resistivity-switching materials is technically challenging; and improved methods of forming memory devices that employ resistivity-switching materials are desirable.

SUMMARY OF THE INVENTION

In a first aspect of the invention, a method of fabricating a memory cell is provided that includes (1) fabricating a steering element above a substrate; and (2) fabricating a reversible-resistance switching element coupled to the steering element by selectively fabricating carbon nano-tube (CNT) material above the substrate.

In a second aspect of the invention, a method of fabricating a memory cell is provided that includes (1) fabricating a first conductor above a substrate; (2) fabricating a reversible-resistance switching element above the first conductor by selectively fabricating carbon nano-tube (CNT) material above the first conductor; (3) fabricating a diode above the first conductor; and (4) fabricating a second conductor above the diode and the reversible resistance-switching element.

In a third aspect of the invention, a method of fabricating a memory cell is provided that includes (1) fabricating a first conductor above a substrate; (2) fabricating a vertical polycrystalline diode above the first conductor; (3) fabricating a reversible-resistance switching element above the vertical polycrystalline diode by selectively fabricating carbon nano-tube (CNT) material above the vertical polycrystalline diode; and (4) fabricating a second conductor above the reversible-resistance switching element.

In a fourth aspect of the invention, a method of fabricating a memory cell is provided that includes (1) fabricating a thin film transistor having a source region and a drain region; (2) fabricating a first conductor coupled to the source region or the drain region of the transistor; (3) fabricating a reversible-resistance switching element coupled to the first conductor by selectively fabricating carbon nano-tube (CNT) material above the first conductor; and (4) fabricating a second conductor above the reversible resistance-switching element.

In a fifth aspect of the invention, a memory cell is provided that includes (1) a steering element; and (2) a reversible resistance-switching element coupled to the steering element and including selectively fabricated carbon nano-tube (CNT) material.

In a sixth aspect of the invention, a memory cell is provided that includes (1) a first conductor; (2) a second conductor formed above the first conductor; (3) a diode formed between the first and second conductors; and (4) a reversible resistance-switching element including carbon nano-tube (CNT) material selectively fabricated between the first and second conductors.

In a seventh aspect of the invention, a memory cell is provided that includes (1) a thin film transistor having a source region and a drain region; (2) a first conductor coupled to the source region or the drain region; (3) a reversible resistance-switching element including carbon nano-tube (CNT) material selectively fabricated above the first conductor; and (4) a second conductor formed above the reversible resistance-switching element.

In an eighth aspect of the invention, a plurality of nonvolatile memory cells is provided that includes (1) a first plurality of substantially parallel, substantially coplanar conductors extending in a first direction; (2) a plurality of diodes; (3) a plurality of reversible resistance-switching elements; and (4) a second plurality of substantially parallel, substantially coplanar conductors extending in a second direction different from the first direction. In each memory cell, one of the diodes and one of the reversible resistance-switching elements are arranged in series, disposed between one of the first conductors and one of the second conductors. Each reversible resistance-switching element includes selectively fabricated carbon nano-tube (CNT) material.

In a ninth aspect of the invention, a monolithic three dimensional memory array is provided that includes a first memory level formed above a substrate. The first memory level includes a plurality of memory cells each having (1) a steering element; and (2) a reversible resistance-switching element coupled to the steering element and including a selectively fabricated carbon nano-tube (CNT) material. At least a second memory level is monolithically formed above the first memory level. Numerous other aspects are provided in accordance with these and other embodiments of the invention.

Other features and aspects of the present invention will become more fully apparent from the following detailed description, the appended claims and the accompanying drawings.

DETAILED DESCRIPTION

Figure 1:
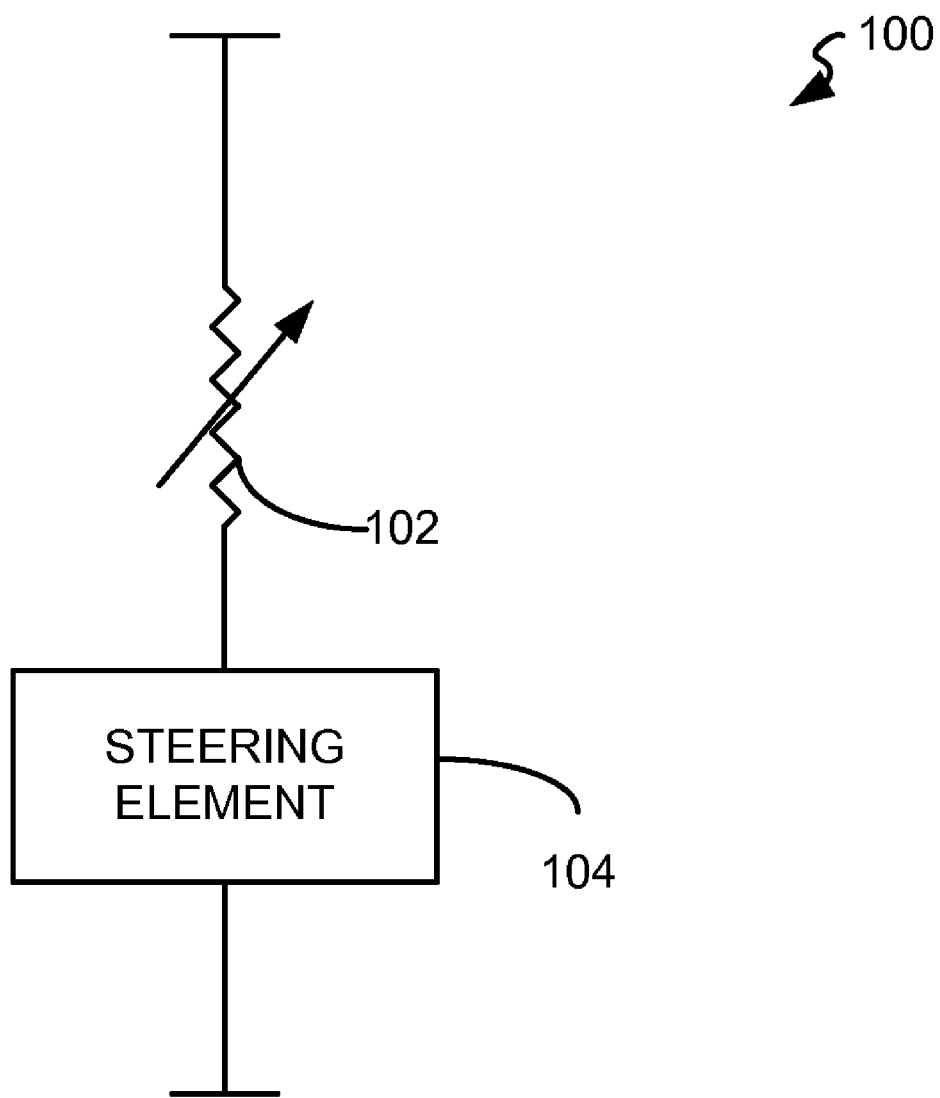
FIG. 1 is a schematic illustration of an exemplary memory cell provided in accordance with the present invention.

Some carbon nano-tube (CNT) materials have been shown to exhibit reversible resistivity-switching properties that may be suitable for use in non-volatile memories. However, deposited or grown CNT material typically has a rough surface topography, with pronounced thickness variations, such as numerous peaks and valleys. These thickness variations make CNT materials difficult to etch without excessive etching of the underlying substrate, increasing fabrication costs and complexity associated with their use in integrated circuits.

In accordance with the present invention, difficult-to-etch, CNT rewriteable resistivity-switching materials may be used within a memory cell without being etched. For example, in at least one embodiment, a memory cell is provided that includes a CNT reversible resistivity-switching material formed by (1) depositing a CNT seeding layer; (2) patterning and etching the CNT seeding layer; and (3) selectively fabricating CNT material on the patterned and etched CNT seeding layer. The CNT seeding layer may be a layer that facilitates CNT formation, such as a surface roughened and/or conducting layer. Selective formation of CNT material on the CNT seeding layer can eliminate or minimize the need to etch the CNT material.

Exemplary CNT seeding layers include titanium nitride, tantalum nitride, nickel, cobalt, iron or the like. In some embodiments, a titanium or tantalum nitride layer may be surface roughened for use as a CNT seeding layer. Such surface roughened titanium or tantalum nitride may itself serve as a CNT seeding layer. In other embodiments, the surface roughened titanium or tantalum nitride layer may be coated with an additional conducting layer to facilitate CNT material formation. Such a conducting layer may be patterned and etched with the titanium or tantalum nitride layer, or selectively deposited on the titanium or tantalum nitride layer after the titanium or tantalum nitride layer is patterned and etched. Exemplary conducting layers include nickel, cobalt, iron, etc.

As used herein, CNT material refers to material that includes one or more single and/or multi-wall CNTs. In some embodiments, the individual tubes of the CNT material may be vertically aligned. Vertically aligned CNTs allow vertical current flow with little or no lateral conduction. In some embodiments, the individual tubes of the CNT material may be fabricated so as to be substantially vertically aligned to reduce or prevent the formation of lateral or bridging conduction paths between adjacent memory cells. This vertical alignment reduces and/or prevents the state of a memory cell from being influenced or "disturbed" by the state and/or programming of adjacent memory cells. Note that individual tube isolation may or may not extend over the entire thickness of the CNT material. For example, during the initial growth phase, some or most of the individual tubes may be vertically aligned and separated. However, as the individual tubes increase in length vertically, portions of the tubes may come in contact with one another, and even become entangled or entwined. Exemplary techniques for forming CNT materials are described below.

Exemplary Inventive Memory Cell

FIG. 1 is a schematic illustration of an exemplary memory cell 100 provided in accordance with the present invention. The memory cell 100 includes a reversible resistance-switching element 102 coupled to a steering element 104.

The reversible resistance-switching element 102 includes a reversible resistivity-switching material (not separately shown) having a resistivity that may be reversibly switched between two or more states. For example, the reversible resistivity-switching material of the element 102 may be in an initial, low-resistivity state upon fabrication. Upon application of a first voltage and/or current, the material is switchable to a high-resistivity state. Application of a second voltage and/or current may return the reversible resistivity-switching material to a low-resistivity state. Alternatively, the reversible resistance-switching element 102 may be in an initial, high-resistance state upon fabrication that is reversibly switchable to a low-resistance state upon application of the appropriate voltage(s) and/or current(s). When used in a memory cell, one resistance state may represent a binary "0" while another resistance state may represent a binary "1", although more than two data/resistance states may be used. Numerous reversible resistivity-switching materials and operation of memory cells employing reversible resistance-switching elements are described, for example, the '939 Application, previously incorporated.

In at least one embodiment of the invention, the reversible resistance-switching element 102 is formed using a selectively deposited or grown CNT material. As will be described further below, use of a selectively formed CNT material eliminates the need to etch the CNT material. Fabrication of the reversible resistance-switching element 102 thereby is simplified.

The steering element 104 may include a thin film transistor, a diode, or another suitable steering element that exhibits non-ohmic conduction by selectively limiting the voltage across and/or the current flow through the reversible resistance-switching element 102. In this manner, the memory cell 100 may be used as part of a two or three dimensional memory array and data may be written to and/or read from the memory cell 100 without affecting the state of other memory cells in the array.

Exemplary embodiments of the memory cell 100, the reversible resistance-switching element 102 and the steering element 104 are described below with reference to FIGS. 2A-5.

First Exemplary Embodiment of a Memory Cell

Figure 2A:
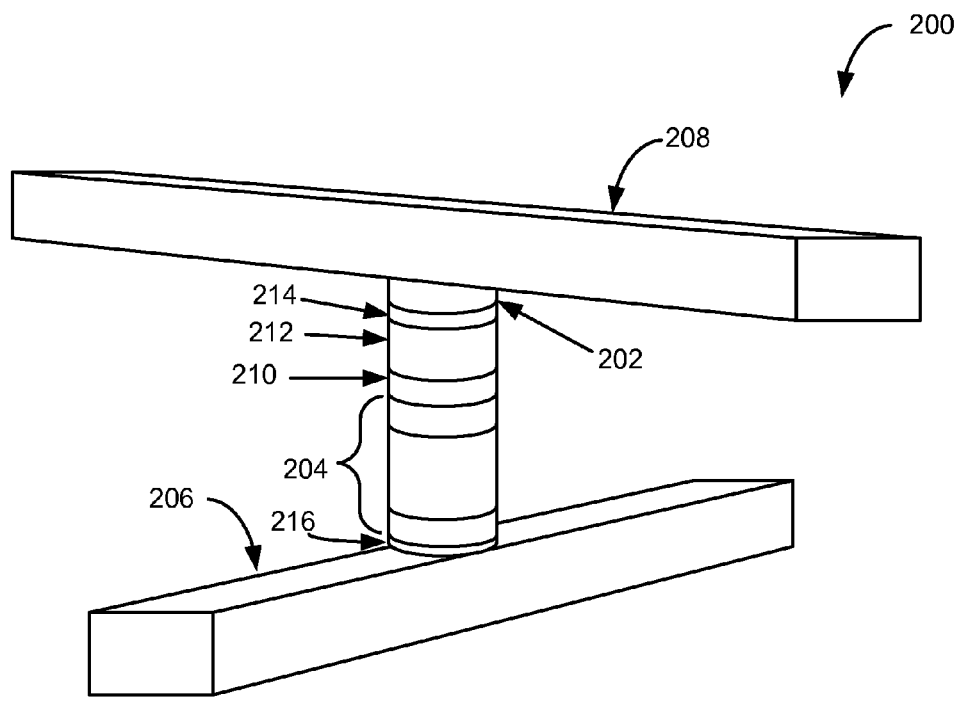
FIG. 2A is a simplified perspective view of a first embodiment of a memory cell provided in accordance with the present invention.

FIG. 2A is a simplified perspective view of a first embodiment of a memory cell 200 provided in accordance with the present invention. With reference to FIG. 2A, the memory cell 200 includes a reversible resistance-switching element 202 coupled in series with a diode 204 between a first conductor 206 and a second conductor 208. In some embodiments, a barrier layer 210, a conductive layer 212 and/or a CNT seeding layer 214 may be formed between the reversible resistance-switching element 202 and the diode 204. For example, the barrier layer 210 may include titanium nitride, tantalum nitride, tungsten nitride, etc., and the conductive layer 212 may include tungsten or another suitable metal layer.

In some embodiments, the CNT seeding layer 214 may be a conducting layer that promotes CNT material formation, such as titanium nitride, tantalum nitride, nickel, cobalt, iron or the like. In one particular embodiment, the CNT seeding layer 214 may be titanium or tantalum nitride with a surface roughened by chemical mechanical polishing (CMP) or another suitable process. In other embodiments, a surface roughened or smooth titanium nitride, tantalum nitride or similar layer may be coated with a metal catalyst layer of nickel, cobalt, iron, etc., that promotes CNT material formation. In still other embodiments, the CNT seeding layer 214 may simply be a metal catalyst layer such as nickel, cobalt, iron or the like that promotes CNT formation.

As will be described further below, the barrier layer 210, conductive layer 212 and/or CNT seeding layer 214 may serve as a hard mask during formation of the diode 204. Use of metal hard masks is described, for example, in U.S. patent application Ser. No. 11/444,936, filed May 13, 2006 and titled "CONDUCTIVE HARD MASK TO PROTECT PATTERNED FEATURES DURING TRENCH ETCH" (hereinafter "the '936 Application") which is hereby incorporated by reference herein in its entirety. An additional barrier layer 216, such as titanium nitride, tantalum nitride, tungsten nitride, etc., also may be formed between the diode 204 and the first conductor 206.

Patterning of the CNT seeding layer 214 with the conductive layer 212, barrier layer 210, diode 204 and/barrier layer 216 simplifies fabrication of the memory cell 200 as additional patterning and etch steps are not required for the CNT seeding layer 214. Further, CNT material will selectively (e.g., only) form on the patterned and etched CNT seeding layer 214 so that etching of CNT material is not required. This selectively formed CNT material serves as the reversible resistance-switching element 202.

In some embodiments, only a portion, such as one or more filaments, of the CNT material that forms the reversible resistance-switching element 202 may switch and/or be switchable.

The diode 204 may include any suitable diode such as a vertical polycrystalline p-n or p-i-n diode, whether upward pointing with an n-region above a p-region of the diode or downward pointing with a p-region above an n-region of the diode. Exemplary embodiments of the diode 204 are described below with reference to FIG. 3A-C.

The first and/or second conductor 206, 208 may include any suitable conductive material such as tungsten, any appropriate metal, heavily doped semiconductor material, a conductive silicide, a conductive silicide-germanide, a conductive germanide, or the like. In the embodiment of FIG. 2A, the first and second conductors 206, 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first and/or second conductors 206 to improve device performance and/or aid in device fabrication.

Figure 2B:
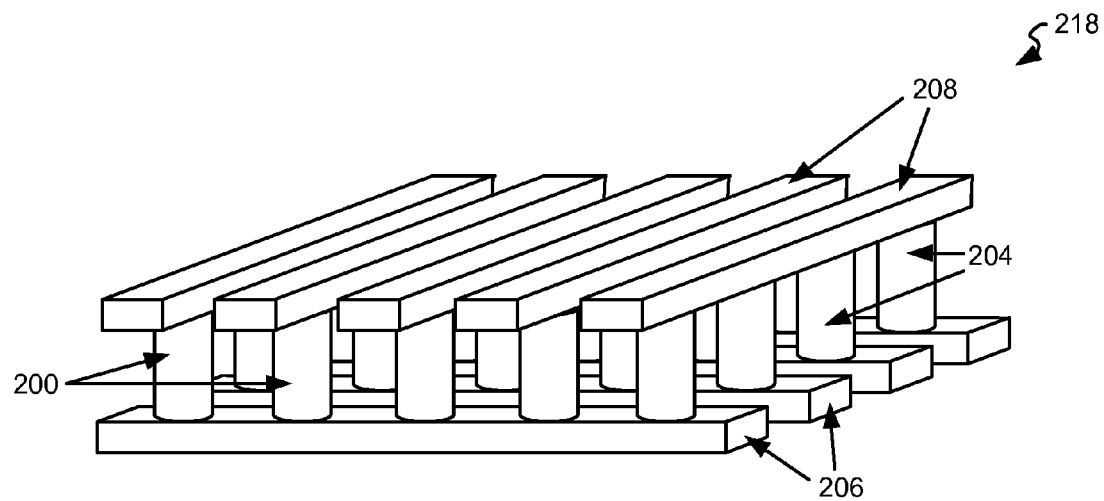
FIG. 2B is a simplified perspective view of a portion of a first memory level formed from a plurality of the memory cells of FIG. 2A.
Figure 2C:
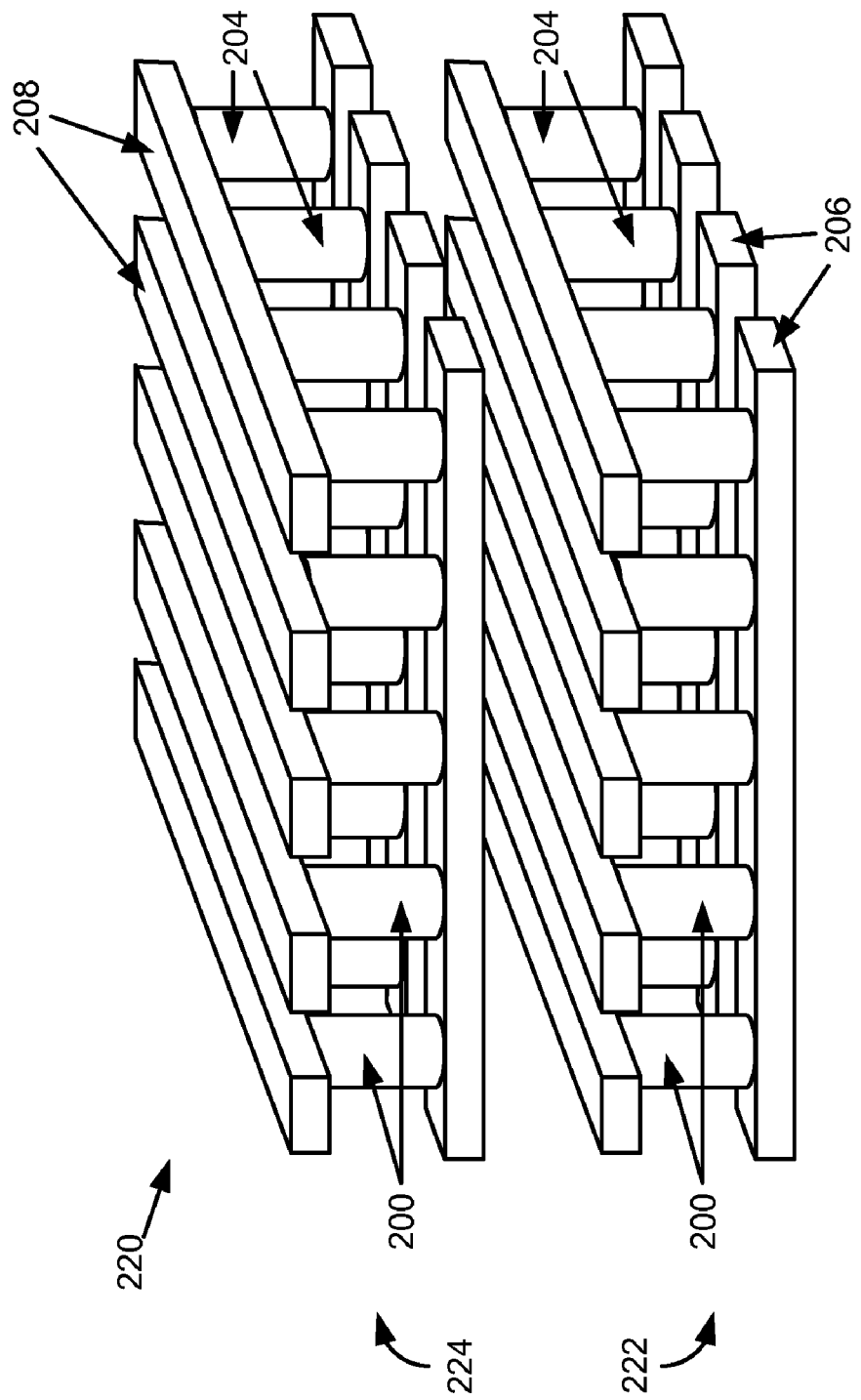
FIG. 2C is a simplified perspective view of a portion of a first exemplary three dimensional memory array provided in accordance with the present invention.

FIG. 2B is a simplified perspective view of a portion of a first memory level 218 formed from a plurality of the memory cells 200 of FIG. 2A. For simplicity, the reversible resistance-switching element 202, the CNT seeding layer 214, the diode 204, the barrier layers 210 and 216 and the conductive layer 212 are not separately shown. The memory array 218 is a "cross-point" array including a plurality of bit lines (second conductors 208) and word lines (first conductors 206) to which multiple memory cells are coupled (as shown). Other memory array configurations may be used, as may multiple levels of memory. For example, FIG. 2C is a simplified perspective view of a portion of a monolithic three dimensional array 220 that includes a first memory level 222 positioned below a second memory level 224. In the embodiment of FIG. 2C, each memory level 222, 224 includes a plurality of memory cells 200 in a cross-point array. It will be understood that additional layers (e.g., an interlevel dielectric) may be present between the first and second memory levels 222 and 224, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
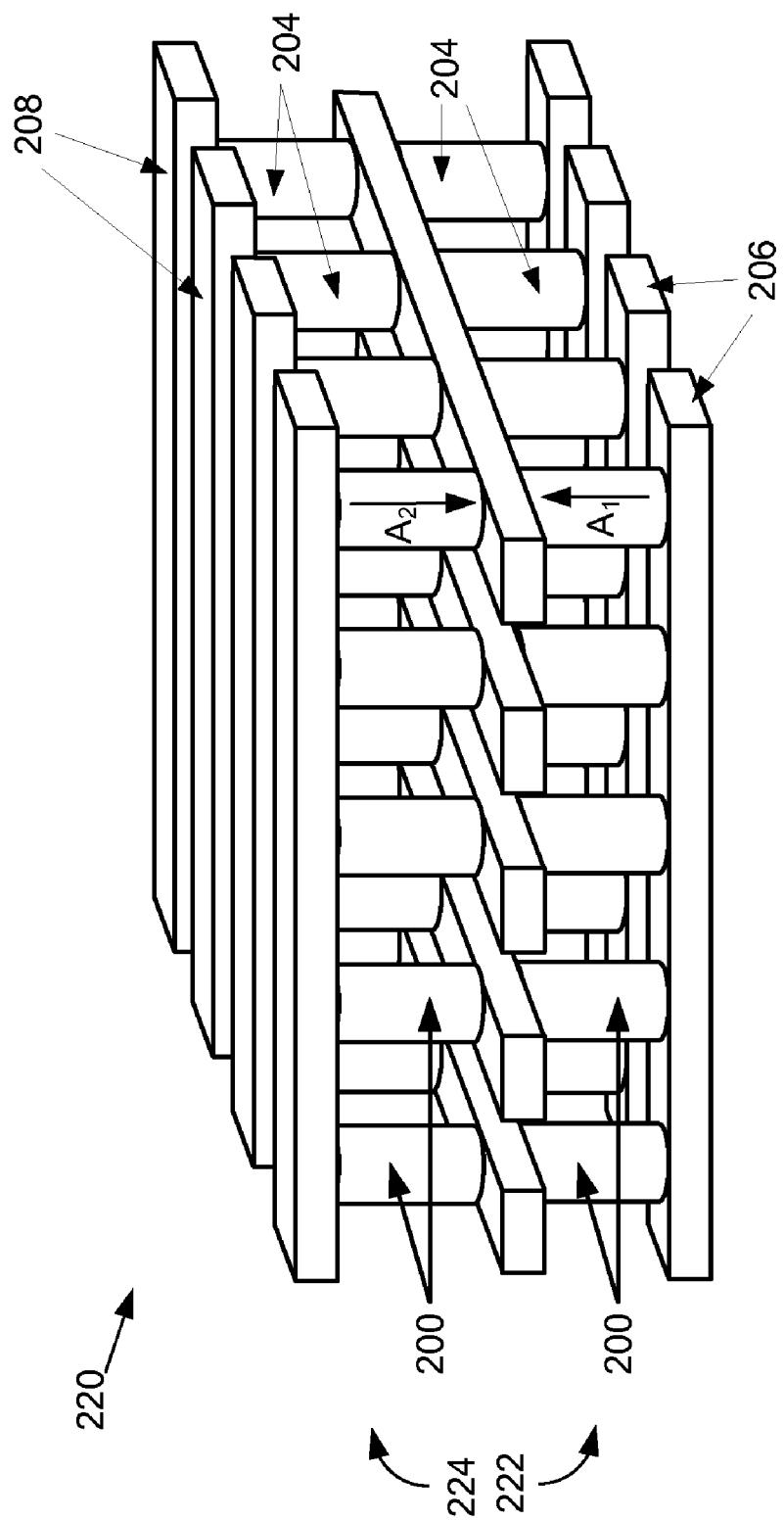
FIG. 2D is a simplified perspective view of a portion of a second exemplary three dimensional memory array provided in accordance with the present invention.

In some embodiments, the memory levels may be formed, as described, for example, in U.S. Pat. No. 6,952,030, "High-density three-dimensional memory cell" which is hereby incorporated by reference herein in its entirety for all purposes. For instance, the upper conductors of a first memory level may be used as the lower conductors of a second memory level that is positioned above the first memory level as shown in FIG. 2D. In such embodiments, the diodes on adjacent memory levels preferably point in opposite directions as described in U.S. patent application Ser. No. 11/692,151, filed Mar. 27, 2007 and titled "LARGE ARRAY OF UPWARD POINTING P-I-N DIODES HAVING LARGE AND UNIFORM CURRENT" (hereinafter "the '151 Application"), which is hereby incorporated by reference herein in its entirety for all purposes. For example, the diodes of the first memory level 222 may be upward pointing diodes as indicated by arrow $A_1$ (e.g., with p regions at the bottom of the diodes), while the diodes of the second memory level 224 may be downward pointing diodes as indicated by arrow $A_2$ (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

Figure 3A:
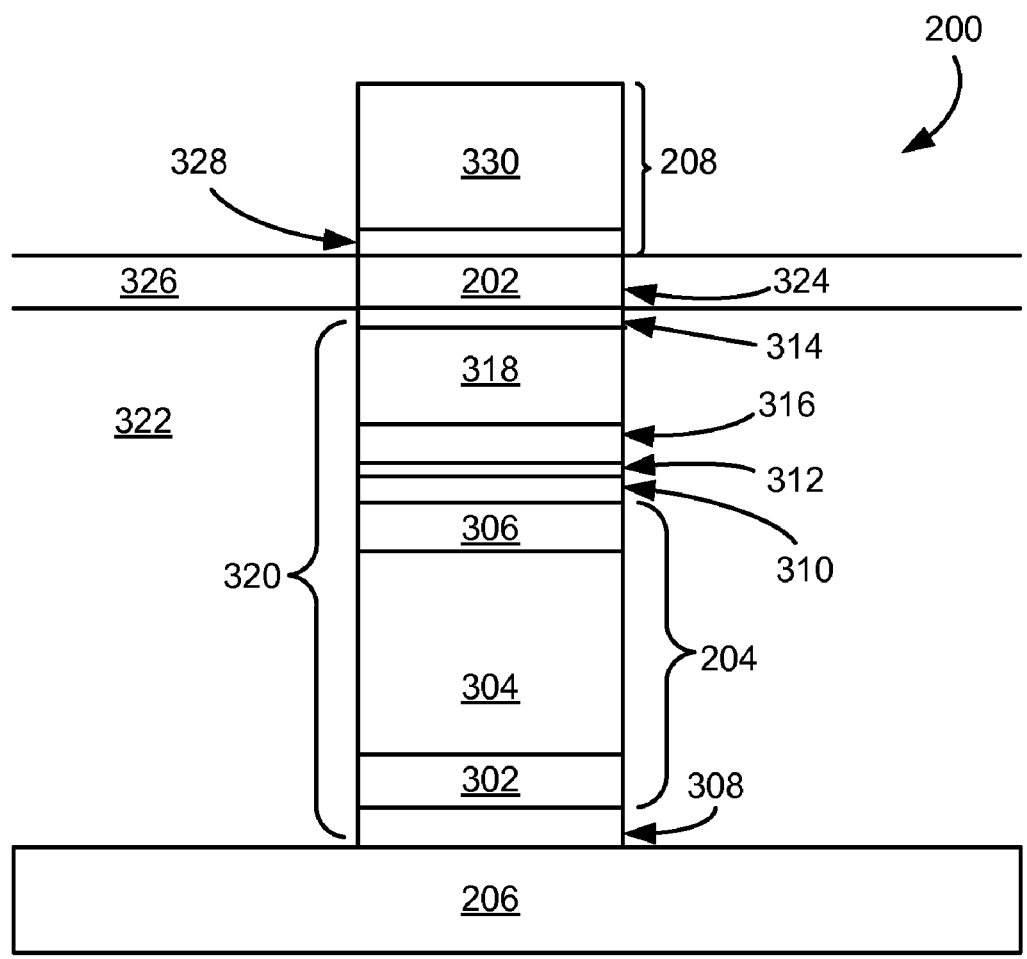
FIG. 3A is a cross-sectional view of a first exemplary embodiment of the memory cell of FIG. 2A.

FIG. 3A is a cross-sectional view of a first exemplary embodiment of the memory cell 200 of FIG. 2A. With reference to FIG. 3A, the memory cell 200 includes the reversible resistance-switching element 202, the diode 204 and the first and second conductors 206, 208.

As stated, the diode 204 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, the diode 204 may be formed from a polycrystalline semiconductor material such as polysilicon, a polycrystalline silicon-germanium alloy, polygermanium or any other suitable material. For example, the diode 204 may include a heavily doped n+ polysilicon region 302, a lightly doped or an intrinsic (unintentionally doped) polysilicon region 304 above the n+ polysilicon region 302 and a heavily doped, p+ polysilicon region 306 above the intrinsic region 304. In some embodiments, a thin germanium and/or silicon-germanium alloy layer (not shown) may be formed on the n+ polysilicon region 302 to prevent and/or reduce dopant migration from the n+ polysilicon region 302 into the intrinsic region 304. Use of such a layer is described, for example, in U.S. patent application Ser. No. 11/298,331, filed Dec. 9, 2005 and titled "DEPOSITED SEMICONDUCTOR STRUCTURE TO MINIMIZE N-TYPE DOPANT DIFFUSION AND METHOD OF MAKING" (hereinafter "the '331 Application"), which is hereby incorporated by reference herein in its entirety for all purposes. In some embodiments, a few hundred angstroms or less of silicon-germanium alloy with about 10 at % or more of germanium may be employed.

It will be understood that the locations of the n+ and p+ regions may be reversed. A barrier layer 308, such as titanium nitride, tantalum nitride, tungsten nitride, etc., may be formed between the first conductor 206 and the n+ region 302 (e.g., to prevent and/or reduce migration of metal atoms into the polysilicon regions).

When the diode 204 is fabricated from deposited silicon (e.g., amorphous or polycrystalline), a silicide layer 310 may be formed on the diode 204 to place the deposited silicon in a low resistivity state, as fabricated. Such a low resistivity state allows for easier programming of the memory cell 200 as a large voltage is not required to switch the deposited silicon to a low resistivity state. For example, a silicide-forming metal layer 312 such as titanium or cobalt may be deposited on the p+ polysilicon region 306. During a subsequent anneal step (described below) employed to crystallize the deposited silicon that forms the diode 204, the silicide-forming metal layer 312 and the deposited silicon of the diode 204 interact to form the silicide layer 310, consuming all or a portion of the silicide-forming metal layer 312.

As described in U.S. Pat. No. 7,176,064, "Memory Cell Comprising a Semiconductor Junction Diode Crystallized Adjacent to a Silicide," which is hereby incorporated by reference herein in its entirety, silicide-forming materials such as titanium and/or cobalt react with deposited silicon during annealing to form a silicide layer. The lattice spacings of titanium silicide and cobalt silicide are close to that of silicon, and it appears that such silicide layers may serve as "crystallization templates" or "seeds" for adjacent deposited silicon as the deposited silicon crystallizes (e.g., the silicide layer 310 enhances the crystalline structure of the silicon diode 204 during annealing). Lower resistivity silicon thereby is provided. Similar results may be achieved for silicon-germanium alloy and/or germanium diodes.

In the embodiment of FIG. 3A, the reversible resistance-switching element 202 is formed by a selective fabrication process in which CNT material is formed on a patterned and etched CNT seeding layer 314. In some embodiments, the CNT seeding layer 314 may be a single layer of roughened metal nitride, such as surface roughened titanium or tantalum nitride, a single layer of a metal catalyst such as nickel, cobalt, iron, etc., or a multi-layer structure formed from a smooth or surface roughened metal nitride coated with a metal catalyst. Exemplary CNT seeding layer materials include titanium or tantalum nitride and/or nickel, cobalt, iron or another suitable metal and/or catalyst.

In some embodiments, the CNT seeding layer 314 and the reversible resistance-switching element 202 may be formed over the conductive silicide-forming metal layer 312. In such embodiments, the CNT seeding layer 314 and silicide-forming metal layer 312 may be patterned and etched during formation of the diode 204 as described below with reference to FIGS. 4A-4D. In other embodiments, a metal hard mask may be formed over the silicide-forming metal layer 312 prior to formation of the CNT seeding layer 314 and resistance-switching element 202. For example, a barrier layer 316 and/or a conductive layer 318 may be formed over the silicide-forming metal layer 312. The CNT seeding layer 314 then may be formed over the conductive layer 318. The barrier layer 316 may include titanium nitride, tantalum nitride, tungsten nitride, etc., and the conductive layer 318 may include tungsten or another suitable metal layer.

As will be described further below, the barrier layer 316 and/or conductive layer 318, as well as the CNT seeding layer 314, may serve as a hard mask during formation of the diode 204 and may mitigate any overetching that may occur during formation of the top conductor 208 (as described in the '936 Application, previously incorporated). For example, the CNT seeding layer 314, barrier layer 316 and conductive layer 318 may be patterned and etched, and then serve as a mask during etching of the diode 204. Etching of the CNT seeding layer 314, conductive layer 318, barrier layer 316, silicide-forming metal layer 312, diode 204 (p+ polysilicon layer 306, intrinsic layer 304, n+ polysilicon layer 302) and barrier layer 308 creates a pillar structure 320. Dielectric material 322 is deposited on top of and around the pillar structure 320 so as to isolate the pillar structure 320 from other similar pillar structures of other memory cells (not shown) fabricated on a memory level that includes the memory cell 200. A CMP or dielectric etchback step then is performed to planarize the dielectric material 322 and remove the dielectric material from the top of the CNT seeding layer 314.

Such a CMP or dielectric etchback step may also roughen the surface of the CNT seeding layer 314. For example, in some embodiments, the CNT seeding layer 314 may include titanium nitride that is roughened by the CMP or dielectric etchback step just described and/or by an additional roughening step. Such a roughened, titanium nitride surface may be employed as a seeding surface for CNT fabrication. For example, roughened titanium nitride has been shown to facilitate formation of vertically aligned CNTs as described by Smith et al., "Polishing TiN for Nanotube Synthesis", Proceedings of the 16$^{th}$ Annual Meeting of the American Society for Precision Engineering, Nov. 10-15, 2001. (See also Rao et al., "In situ-grown carbon nanotube array with excellent field emission characteristics", Appl. Phys. Lett., Vol. 76, No. 25, 19 June 200, pp. 3813-3815.)

As an example, the CNT seeding layer 314 may be about 1000 to about 5000 angstroms of a metal nitride such as titanium or tantalum nitride with an arithmetic average surface roughness Ra of about 850 to about 4000 angstroms, and more preferably about 4000 angstroms. In some embodiments, about 1 to about 200 angstroms, and more preferably about 20 angstroms or less, of a metal catalyst layer such as nickel, cobalt, iron, etc., may be deposited onto the surface roughened metal nitride layer prior to CNT formation. In yet other embodiments, the CNT seeding layer 314 may include about 20 to about 500 angstroms of non-roughened or smooth titanium, tantalum or similar metal nitride coated with about 1 to about 200 angstroms, and more preferably about 20 angstroms or less, of a metal catalyst layer such as nickel, cobalt, iron, etc. The nickel, cobalt, iron or other metal catalyst layer in any embodiment may be a continuous or non-continuous film. Other materials, thicknesses and surface roughnesses may be used.

Following planarization of the dielectric material 322, a CNT fabrication process is performed to selectively grow and/or deposit CNT material 324 on the CNT seeding layer 314. This CNT material 324 serves as the reversible resistance-switching element 202. Any suitable method may be used to form CNT material on the CNT seeding layer 314. For example, chemical vapor deposition (CVD), plasma-enhanced CVD, laser vaporization, electric arc discharge or the like may be employed.

In one exemplary embodiment, CNTs may be formed on a TiN seeding layer by chemical vapor deposition (CVD) at a temperature of about 675 to 700° C. in xylene, argon, hydrogen and/or ferrocene at a flow rate of about 100 sccm for about 30 minutes. Other temperatures, gases, flow rates and/or growth times may be used.

In another exemplary embodiment, CNTs may be formed on a nickel catalyst layer by CVD at a temperature of about 650° C. in about 20% $C_2H_4$ and 80% Argon at a pressure of about 5.5 Torr for about 20 minutes. Other temperatures, gases, ratios, pressures and/or growth times may be used.

In yet another embodiment, CNTs may be formed on a metal catalyst layer such as nickel, cobalt, iron, etc., using plasma enhanced CVD at a temperature of about 600 to 900° C. in about 20% methane, ethylene, acetylene or another hydrocarbon diluted with about 80% argon, hydrogen and/or ammonia using an RF power of about 100-200 Watts for about 8-30 minutes. Other temperatures, gases, ratios, powers and/or growth times may be used.

As stated, CNT material 324 forms only over the CNT seeding layer 314 of pillar structure 320 (and other similar pillar structures (not shown) of other memory cells fabricated on a memory level that includes the memory cell 200). In some embodiments, the CNT material 324 may have a thickness of about 1 nanometers to about 1 micron (and even tens of microns), and more preferably about 10 to about 20 nanometers, although other CNT material thicknesses may be used. The density of the individual tubes in the CNT material 324 may be, for example, about $6.6 \times 10^3$ to about $1 \times 10^6$ CNTs/micron$^2$, and more preferably at least about $6.6 \times 10^4$ CNTs/micron$^2$, although other densities may be used. For example, assuming the pillar structure 320 has a width of about 45 nanometers, in some embodiments, it is preferred to have at least about 10 CNTs, and more preferably at least about 100 CNTs, in the CNT material 324 (although fewer CNTs, such as 1, 2, 3, 4, 5, etc., or more CNTs, such as more than 100, may be employed).

To improve the reversible resistivity-switching characteristics of the CNT material 324, in some embodiments it may be preferable that at least about 50%, and more preferably at least about ⅔, of the carbon nano-tubes of the CNT material 324 are semiconducting. As multiple wall CNTs are generally metallic while single wall CNTs may be metallic or semiconducting, in one or more embodiments, it may be preferable for the CNT material 324 to include primarily semiconducting single wall CNTS. In other embodiments, fewer than 50% of the CNTs of the CNT material 324 may be semiconducting.

Vertically aligned CNTs allow vertical current flow with little or no lateral conduction. To prevent the formation of lateral or bridging conduction paths between adjacent pillar structures 320, in some embodiments, the individual tubes of the CNT material 324 may be fabricated so as to be substantially vertically aligned (e.g., thereby reducing and/or preventing the state of a memory cell from being influenced or "disturbed" by the state and/or programming of adjacent memory cells). Note that this vertical alignment may or may not extend over the entire thickness of the CNT material 324. For example, during the initial growth phase, some or most of the individual tubes may be vertical aligned (e.g., not touching). However, as the individual tubes increase in length vertically, portions of the tubes may come in contact with one another, and even become entangled or entwined.

In some embodiments, defects may be intentionally created in the CNT material 324 to improve or otherwise tune the reversible resistivity-switching characteristics of the CNT material 324. For example, after the CNT material 324 has been formed on the CNT seeding layer 314, argon, $O_2$ or another species may be implanted into the CNT material 324 to create defects in the CNT material 324. In a second example, the CNT material 324 may be subjected or exposed to an argon or $O_2$ plasma (biased or chemical) to intentionally create defects in the CNT material 324.

Following formation of the CNT material 324/reversible resistance-switching element 202, dielectric material 326 is deposited on top of and around the CNT material 324 so as to isolate the CNT material 324 from other similar CNT material regions of other memory cells (not shown) fabricated on a memory level that includes the memory cell 200. A CMP or dielectric etchback step then is performed to planarize the dielectric material 326 and remove the dielectric material from the top of the CNT material 324.

Following planarization of the dielectric material 326, the top conductor 208 is formed. In some embodiments, one or more barrier layers and/or adhesion layers 328 may be formed over the CNT material 324/reversible resistance-switching element 202 prior to deposition of a conductive layer 330. The conductive layer 330 and barrier layer 328 may be patterned and/or etched together to form the top conductor 208. In some embodiments, the top conductor 208 may be formed using a damascene process as described below with reference to FIGS. 4A-4D.

Following formation of the top conductor 208, the memory cell 200 may be annealed to crystallize the deposited semiconductor material of the diode 204 (and/or to form the silicide layer 310). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. As stated, the silicide layer 310 may serve as a "crystallization template" or "seed" during annealing for underlying deposited semiconductor material that forms the diode 204. Lower resistivity diode material thereby is provided.

Figure 3B:
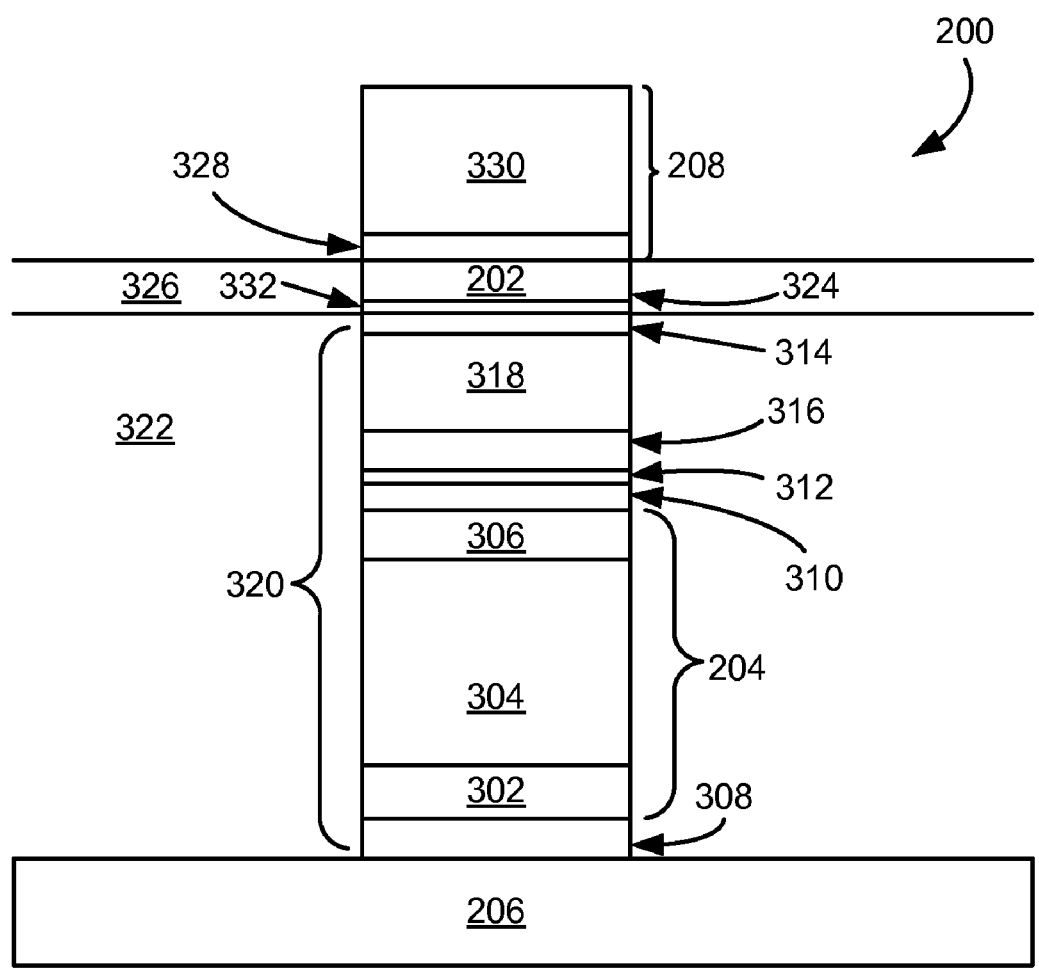
FIG. 3B is a cross-sectional view of a second exemplary embodiment of the memory cell of FIG. 2A.

In some embodiments, the CNT seeding layer 314 may include one or more additional layers. For example, FIG. 3B is a cross-sectional view of a second exemplary embodiment of the memory cell 200 of FIG. 2A in which the CNT seeding layer 314 includes an additional metal catalyst layer 332. The metal catalyst layer 332 may be selectively deposited over the CMP or etchback exposed CNT seeding layer 314. For example, in some embodiments, a nickel, cobalt, iron, etc., metal catalyst layer 332 may be selectively formed over a surface roughened titanium or tantalum nitride CNT seeding layer 314 by electroless deposition, electroplating or the like. The CNT material 324 then may be formed over the metal catalyst coated CNT seeding layer 314. In some embodiments, use of the metal catalyst layer 332 may eliminate the need for a catalyst precursor during CNT formation. Exemplary metal catalyst layer thicknesses range from about 1 to 200 angstroms, although other thicknesses may be used. Such an embodiment may be used with or without the metal hard mask layers 316 and 318. A nickel, cobalt, iron, or similar metal catalyst layer also may be formed over a non-surface-roughened or smooth titanium nitride, tantalum nitride or similar layer by electroless deposition, electroplating or the like.

Figure 3C:
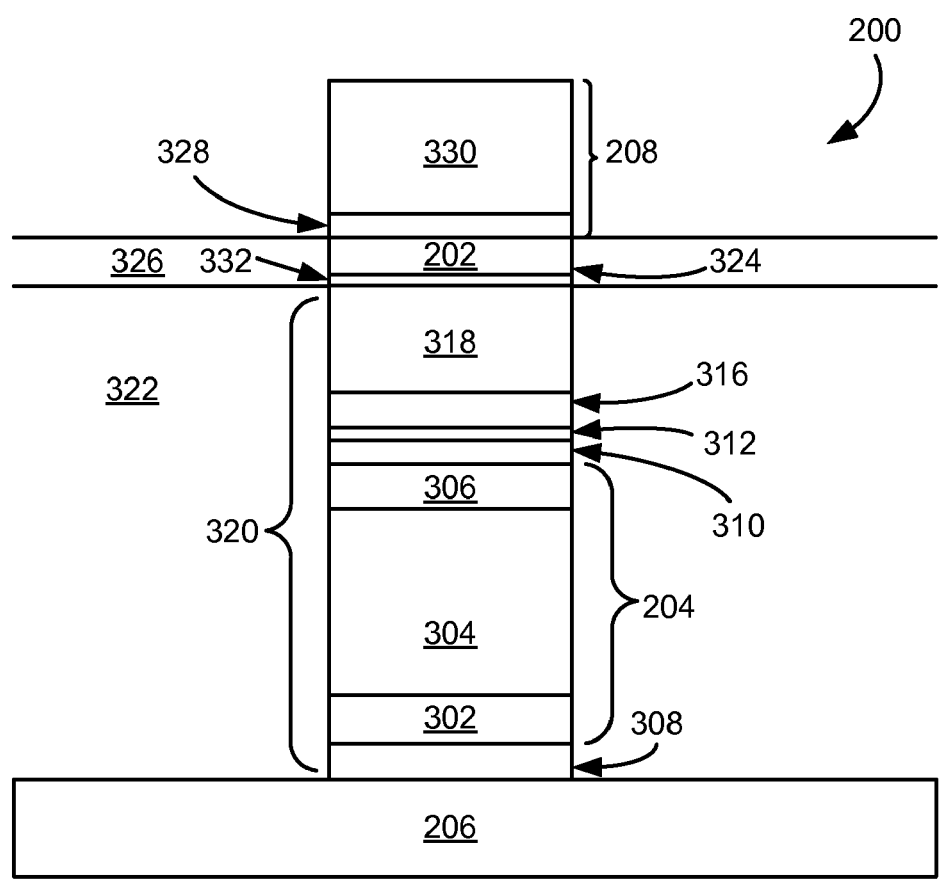
FIG. 3C is a cross-sectional view of a third exemplary embodiment of the memory cell of FIG. 2A.

In another embodiment, only the metal catalyst layer 332 may be used for CNT seeding. For example, FIG. 3C is a cross-sectional view of a third exemplary embodiment of the memory cell 200 of FIG. 2A. The memory cell 200 of FIG. 3C is similar to the memory cell 200 of FIG. 3B, but does not include the surface roughened CNT seeding layer 314. In the embodiment shown, no CNT seeding layer 314 is deposited over the conductive layer 318 prior to formation of the pillar structure 320. After pillar structure 320 is formed, dielectric material 322 is deposited on top of and around the pillar structure 320 and planarized to expose the top of the conductive layer 318. A metal catalyst layer 332 such as nickel, cobalt, iron, etc., then is selectively deposited on the exposed conductive layer 318, and CNT material 324 may be formed over the metal catalyst layer 332. In general, such an embodiment may be used with or without the metal hard mask layers 316 and 318.

Exemplary Fabrication Process for a Memory Cell

FIGS. 4A-D illustrate cross sectional views of a portion of a substrate 400 during fabrication of a first memory level in accordance with the present invention. As will be described below, the first memory level includes a plurality of memory cells that each include a reversible resistance-switching element formed by selectively fabricating carbon nano-tube (CNT) material above a substrate. Additional memory levels may be fabricated above the first memory level (as described previously with reference to FIGS. 2C-2D).

Figure 4A:
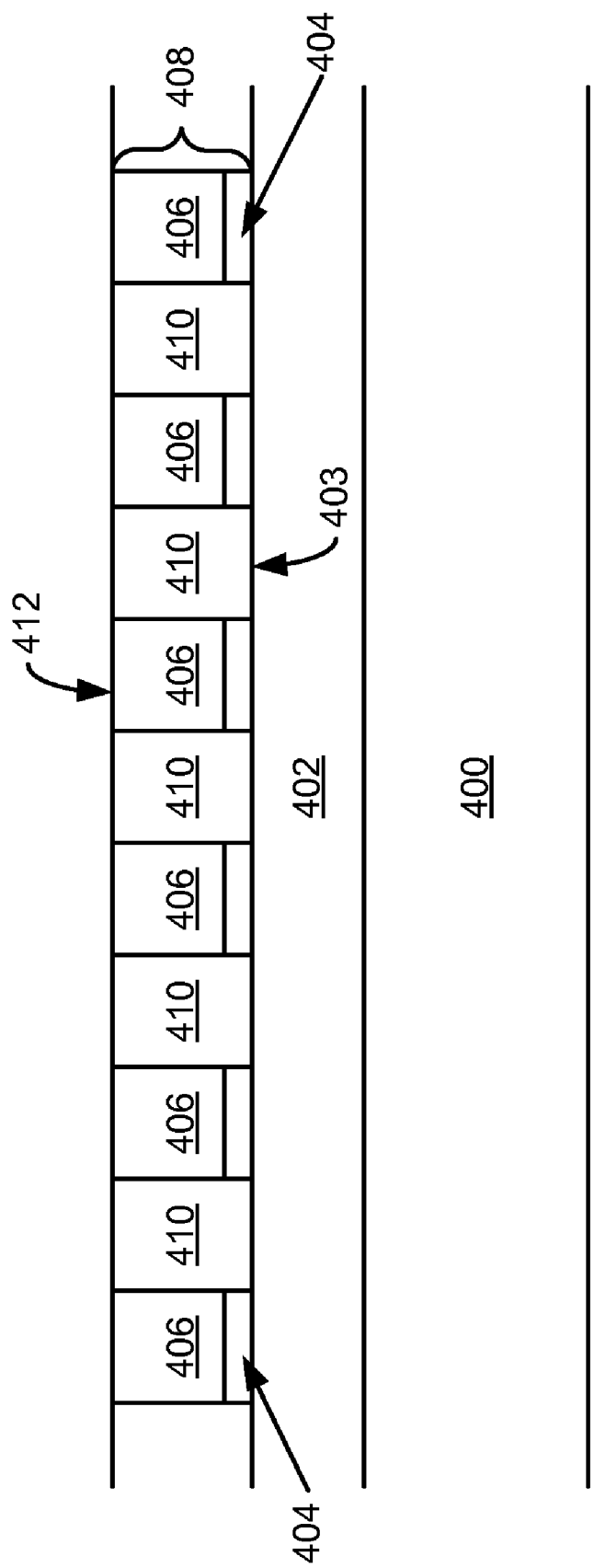
FIGS. 4A-D illustrate cross sectional views of a portion of a substrate during fabrication of a single memory level in accordance with the present invention.

With reference to FIG. 4A, the substrate 400 is shown as having already undergone several processing steps. The substrate 400 may be any suitable substrate such as a silicon, germanium, silicon-germanium, undoped, doped, bulk, silicon-on-insulator (SOI) or other substrate with or without additional circuitry. For example, the substrate 400 may include one or more n-well or p-well regions (not shown).

Isolation layer 402 is formed above the substrate 400. In some embodiments, the isolation layer 402 may be a layer of silicon dioxide, silicon nitride, silicon oxynitride or any other suitable insulating layer.

Following formation of the isolation layer 402, an adhesion layer 404 is formed over the isolation layer 402 (e.g., by physical vapor deposition or another method). For example, the adhesion layer 404 may be about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, the adhesion layer 404 may be optional.

After formation of the adhesion layer 404, a conductive layer 406 is deposited over the adhesion layer 404. The conductive layer 406 may include any suitable conductive material such as tungsten or another appropriate metal, heavily doped semiconductor material, a conductive silicide, a conductive silicide-germanide, a conductive germanide, or the like deposited by any suitable method (e.g., chemical vapor deposition (CVD), physical vapor deposition (PVD), etc.). In at least one embodiment, the conductive layer 406 may comprise about 200 to about 2500 angstroms of tungsten. Other conductive layer materials and/or thicknesses may be used.

Following formation of the conductive layer 406, the adhesion layer 404 and the conductive layer 406 are patterned and etched. For example, the adhesion layer 404 and the conductive layer 406 may be patterned and etched using conventional lithography techniques, with a soft or hard mask, and wet or dry etch processing. In at least one embodiment, the adhesion layer 404 and conductive layer 406 are patterned and etched so as to form substantially parallel, substantially co-planar conductors 408 (as shown in FIG. 4A). Exemplary widths for the conductors 408 and/or spacings between the conductors 408 range from about 200 to about 2500 angstroms, although other conductor widths and/or spacings may be used.

After the conductors 408 have been formed, a dielectric layer 410 is formed over the substrate 400 so as to fill the voids between the conductors 408. For example, approximately 3000-7000 angstroms of silicon dioxide may be deposited on the substrate 400 and planarized using chemical mechanical polishing or an etchback process to form a planar surface 412. The planar surface 412 includes exposed top surfaces of the conductors 408 separated by dielectric material (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

In other embodiments of the invention, the conductors 408 may be formed using a damascene process in which the dielectric layer 410 is formed, patterned and etched to create openings or voids for the conductors 408. The openings or voids then may be filled with the adhesion layer 404 and the conductive layer 406 (and/or a conductive seed, conductive fill and/or barrier layer if needed). The adhesion layer 404 and conductive layer 406 then may be planarized to form the planar surface 412. In such an embodiment, the adhesion layer 404 will line the bottom and sidewalls of each opening or void.

Figure 4B:
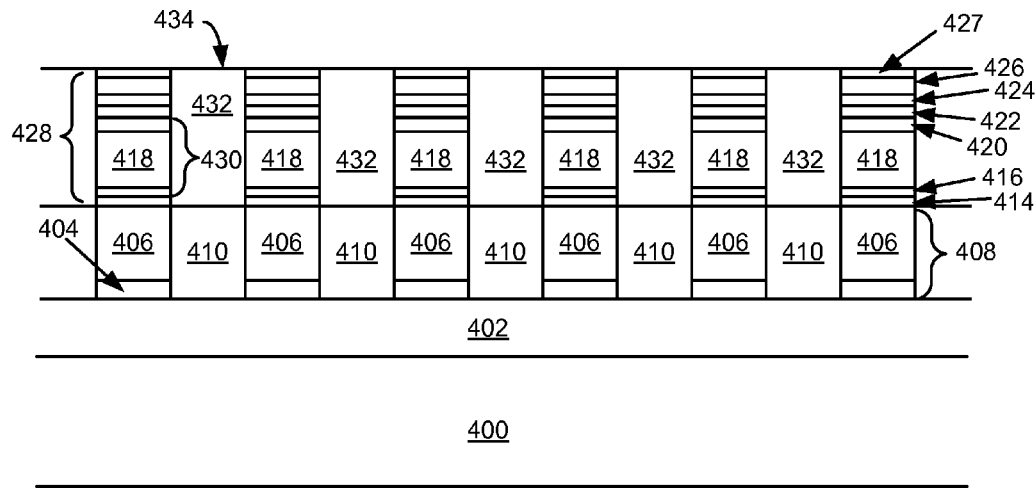
Figure 4C:
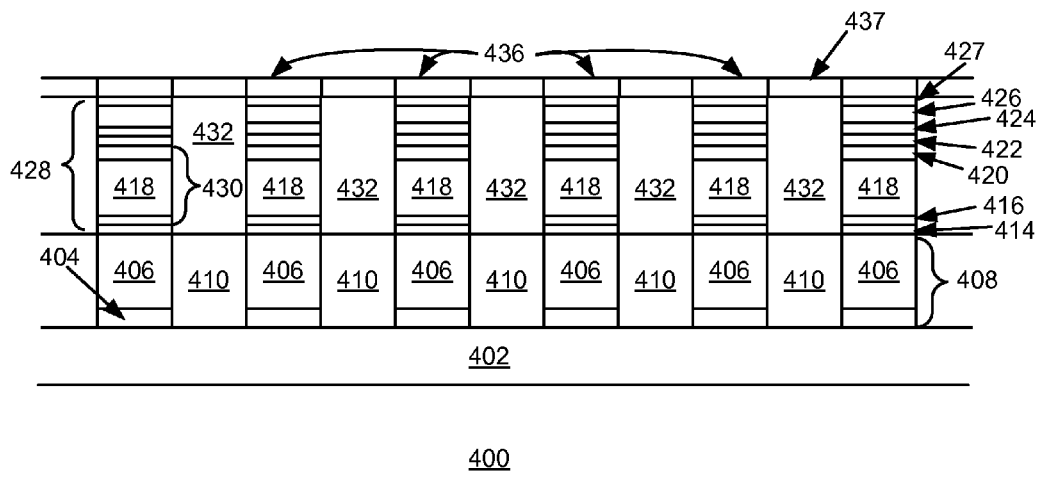

Following planarization, the diode structures of each memory cell are formed. With reference to FIG. 4B, a barrier layer 414 is formed over the planarized top surface 412 of the substrate 400. The barrier layer 414 may be about 20 to about 500 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of the barrier layer 414, deposition of the semiconductor material used to form the diode of each memory cell begins (e.g., diode 204 in FIGS. 2A-3). Each diode may be a vertical p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference to FIG. 4B, following formation of the barrier layer 414, a heavily doped n+ silicon layer 416 is deposited on the barrier layer 414. In some embodiments, the n+ silicon layer 416 is in an amorphous state as deposited. In other embodiments, the n+ silicon layer 416 is in a polycrystalline state as deposited. CVD or another suitable process may be employed to deposit the n+ silicon layer 416. In at least one embodiment, the n+ silicon layer 416 may be formed, for example, from about 100 to about 1000 angstroms, preferably about 100 angstroms, of phosphorus or arsenic doped silicon having a doping concentration of about $10^{21}$ cm$^{-3}$. Other layer thicknesses, doping types and/or doping concentrations may be used. The n+ silicon layer 416 may be doped in situ, for example, by flowing a donor gas during deposition. Other doping methods may be used (e.g., implantation).

After deposition of the n+ silicon layer 416, a lightly doped, intrinsic and/or unintentionally doped silicon layer 418 is formed over the n+ silicon layer 416. In some embodiments, the intrinsic silicon layer 418 is in an amorphous state as deposited. In other embodiments, the intrinsic silicon layer 418 is in a polycrystalline state as deposited. CVD or another suitable deposition method may be employed to deposit the intrinsic silicon layer 418. In at least one embodiment, the intrinsic silicon layer 418 may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on the n+ silicon layer 416 prior to deposition of the intrinsic silicon layer 418 to prevent and/or reduce dopant migration from the n+ silicon layer 416 into the intrinsic silicon layer 418 (as described in the '331 Application, previously incorporated).

Heavily doped, p-type silicon is either deposited and doped by ion implantation or is doped in situ during deposition to form a p+ silicon layer 420. For example, a blanket p+ implant may be employed to implant boron a predetermined depth within the intrinsic silicon layer 418. Exemplary implantable molecular ions include $BF_2$, $BF_3$, B and the like. In some embodiments, an implant dose of about $1-5\times10^{15}$ ions/cm$^2$ may be employed. Other implant species and/or doses may be used. Further, in some embodiments, a diffusion process may be employed. In at least one embodiment, the resultant p+ silicon layer 420 has a thickness of about 100-700 angstroms, although other p+ silicon layer sizes may be used.

Following formation of the p+ silicon layer 420, a silicide-forming metal layer 422 is deposited over the p+ silicon layer 420. Exemplary silicide-forming metals include sputter or otherwise deposited titanium or cobalt. In some embodiments, the silicide-forming metal layer 422 has a thickness of about 10 to about 200 angstroms, preferably about 20 to about 50 angstroms and more preferably about 20 angstroms. Other silicide-forming metal layer materials and/or thicknesses may be used.

A barrier layer 424 is deposited over the silicide-forming metal layer 422. The barrier layer 424 may be about 20 to about 500 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

Following formation of the barrier layer 424, a conductive layer 426 is formed over the barrier layer 424. The conductive layer 426 may be about 50 to about 1000 angstroms, and preferably about 500 angstroms of conductive material such as tungsten or another suitable metal.

Following formation of the conductive layer 426, a CNT seeding layer 427 is formed over the conductive layer 426. In some embodiments, the CNT seeding layer 427 may be about 1000 to about 5000 angstroms of titanium or tantalum nitride, although other thicknesses may be used.

The barrier layer 414, silicon regions 416, 418, and 420, silicide-forming metal layer 422, barrier layer 424, conductive layer 426 and CNT seeding layer 427 are then patterned and etched into pillars 428. For example, initially, the CNT seeding layer 427, conductive layer 426 and barrier layer 424 are etched. The etch continues, etching silicide-forming metal layer 422, silicon regions 420, 418, and 416 and barrier layer 414. CNT seeding layer 427, conductive layer 426 and barrier layer 414 serve as a hard mask during the silicon etch. A hard mask is an etched layer which serves to pattern the etch of an underlying layer; if all of the photoresist present on the CNT seeding layer 427 has been consumed, the hard mask can provide the pattern in its stead. In this manner, the pillars 428 are formed in a single photolithographic step. Conventional lithography techniques, and wet or dry etch processing may be employed to form the pillars 428. Each pillar 428 includes a p-i-n, downward-pointing diode 430. Upward-pointing p-i-n diodes may be similarly formed.

After the pillars 428 have been formed, a dielectric layer 432 is deposited over the pillars 428 to fill the voids between the pillars 428. For example, approximately 200-7000 angstroms of silicon dioxide may be deposited and planarized using chemical mechanical polishing or an etchback process to form a planar surface 434. The planar surface 434 includes exposed top surfaces of the pillars 428 separated by dielectric material 432 (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

After formation of the planar surface 434, CNT material 436 (FIG. 4C) is selectively formed on the CNT seeding layer 427 of each pillar 428. If the CNT seeding layer 427 is titanium nitride, tantalum nitride or a similar material, the surface of the CNT seeding layer 427 may be roughened to allow CNTs to be formed directly on the CNT seeding layer 427. (See, for example, Smith et al., "Polishing TiN for Nanotube Synthesis", Proceedings of the 16th Annual Meeting of the American Society for Precision Engineering, Nov. 10-15, 2001 and Rao et al., "In situ-grown carbon nanotube array with excellent field emission characteristics", Appl. Phys. Lett., Vol. 76, No. 25, 19 June 200, pp. 3813-3815). In one or more embodiments, the CNT seeding layer 427 may be roughened so as to have an arithmetic average surface roughness Ra of at least about 850 to 4000 angstroms, and more preferably at least about 4000 angstroms. Other surface roughnesses may be employed.

In some embodiments, an additional metal catalyst/seeding layer (not shown) such as nickel, cobalt, iron, etc., may be selectively deposited over a surface-roughened CNT seeding layer 427 prior to formation of the CNT material 436 to provide the benefits a metal catalyst during CNT formation (as described previously with reference to FIG. 3B). In other embodiments, a metal catalyst layer may be used without an underlying, surface roughened seeding layer (as described previously with reference to FIG. 3C).

In either case, a CNT fabrication process is performed to selectively grow and/or deposit CNT material 436 on each pillar 428. This CNT material 436 serves as the reversible resistance-switching element 202. Any suitable method may be used to form CNT material 436 on each pillar 428. For example, chemical vapor deposition (CVD), plasma-enhanced CVD, laser vaporization, electric arc discharge or the like may be employed.

In one exemplary embodiment, CNTs may be formed on a TiN seeding layer by chemical vapor deposition (CVD) at a temperature of about 675 to 700° C. in xylene, argon, hydrogen and/or ferrocene at a flow rate of about 100 sccm for about 30 minutes. Other temperatures, gases, flow rates and/or growth times may be used.

In another exemplary embodiment, CNTs may be formed on a nickel catalyst layer by CVD at a temperature of about 650° C. in about 20% $C_2H_4$ and 80% Argon at a pressure of about 5.5 Torr for about 20 minutes. Other temperatures, gases, ratios, pressures and/or growth times may be used.

In yet another embodiment, CNTs may be formed on a metal catalyst layer such as nickel, cobalt, iron, etc., using plasma enhanced CVD at a temperature of about 600 to 900° C. in about 20% methane, ethylene, acetylene or another hydrocarbon diluted with about 80% argon, hydrogen and/or ammonia using an RF power of about 100-200 Watts for about 8-30 minutes. Other temperatures, gases, ratios, powers and/or growth times may be used.

As stated, CNT material 436 forms only over the CNT seeding layer 427 of each pillar 428. In some embodiments, the CNT material 436 may have a thickness of about 1 nanometers to about 1 micron (and even tens of microns), and more preferably about 10 to about 20 nanometers, although other CNT material thicknesses may be used. The density of individual tubes in the CNT material 436 may be, for example, about $6.6 \times 10^3$ to about $1 \times 10^6$ CNTs/micron$^2$, and more preferably at least about $6.6 \times 10^4$ CNTs/micron$^2$, although other densities may be used. For example, assuming the pillars 428 have a width of about 45 nanometers, in some embodiments, it is preferred to have at least about 10 CNTs, and more preferably at least about 100 CNTs, in the CNT material 436 formed on each pillar 428 (although fewer CNTs, such as 1, 2, 3, 4, 5, etc., or more CNTs, such as more than 100, may be employed).

Following formation of the CNT material/reversible resistance-switching element 436 on each pillar 428, dielectric material 437 is deposited on top of and around the regions of CNT material 436 so as to isolate adjacent CNT material regions from one another. A CMP or dielectric etchback step then is performed to planarize the dielectric material 427 and remove the dielectric material from the top of the regions of CNT material 436. For example, approximately 200-7000 angstroms, and in some embodiments a micron or more, of silicon dioxide may be deposited and planarized using chemical mechanical polishing or an etchback process. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Figure 4D:
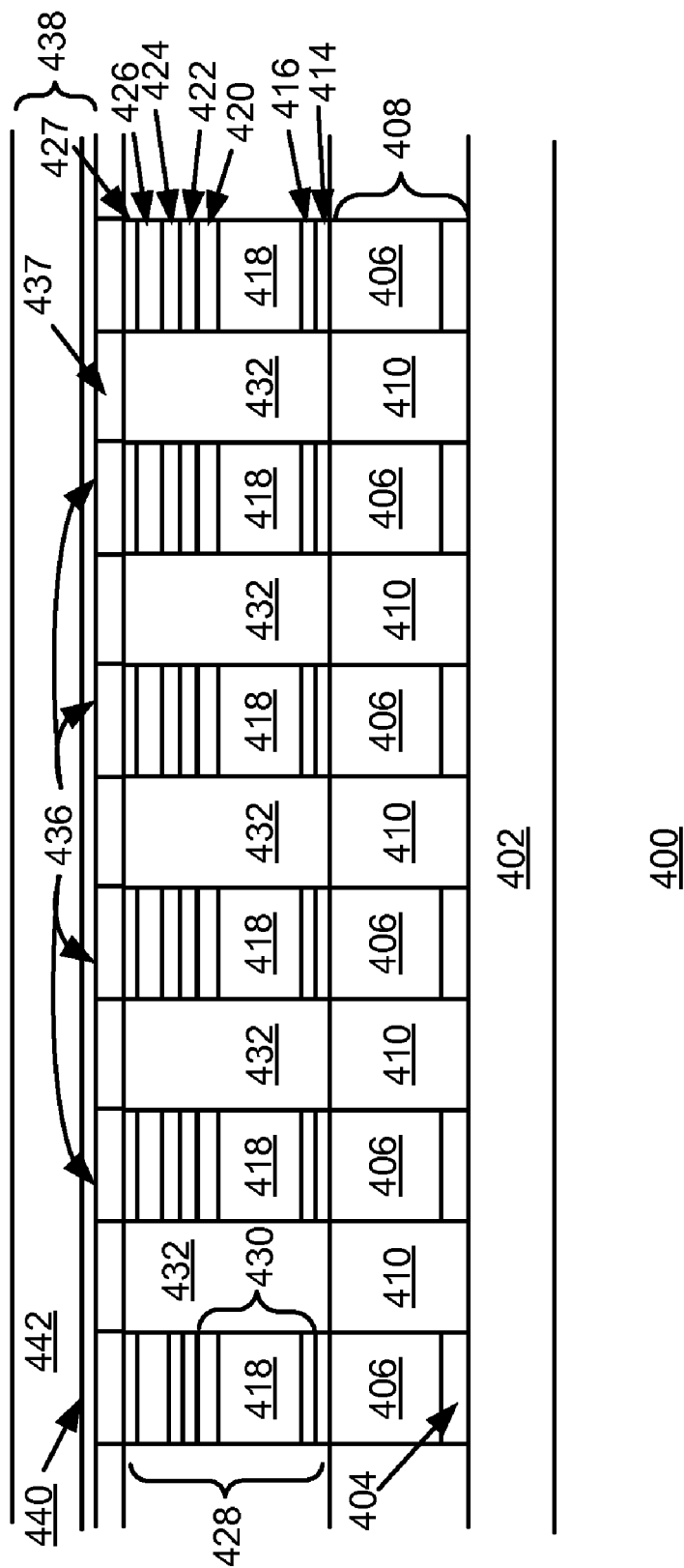

With reference to FIG. 4D, following planarization of the dielectric material 437, a second set of conductors 438 may be formed above the pillars 428 in a manner similar to the formation of the bottom set of conductors 408. For example, as shown in FIG. 4D, in some embodiments, one or more barrier layers and/or adhesion layers 440 may be deposited over the reversible resistance-switching elements 436 prior to deposition of a conductive layer 442 used to form the upper, second set of conductors 438.

The conductive layer 442 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. Barrier layers and/or adhesion layers 440 may include titanium nitride or another suitable layer such as tantalum nitride, tungsten nitride, combinations of one or more layers, or any other suitable material(s). The deposited conductive layer 442 and barrier and/or adhesion layer 440, may be patterned and etched to form the second set of conductors 438. In at least one embodiment, the upper conductors 438 are substantially parallel, substantially coplanar conductors that extend in a different direction than the lower conductors 408.

In other embodiments of the invention, the upper conductors 438 may be formed using a damascene process in which a dielectric layer is formed, patterned and etched to create openings or voids for the conductors 438. As described in the '936 Application, the conductive layer 426 and barrier layer 424 may mitigate the affects of overetching of such a dielectric layer during formation of the openings or voids for the upper conductors 438, preventing accidental shorting of the diodes 430.

The openings or voids may be filled with the adhesion layer 440 and the conductive layer 442 (and/or a conductive seed, conductive fill and/or barrier layer if needed). The adhesion layer 440 and conductive layer 442 then may be planarized to form a planar surface.

Following formation of the upper conductors 438, the resultant structure may be annealed to crystallize the deposited semiconductor material of the diodes 430 (and/or to form silicide regions by reaction of the silicide-forming metal layer 422 with p+ region 420). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. The silicide regions formed as each silicide-forming metal layer region 422 and p+ region 420 react may serve as "crystallization templates" or "seeds" during annealing for underlying deposited semiconductor material that forms the diodes 430 (e.g., changing any amorphous semiconductor material to polycrystalline semiconductor material and/or improving overall crystalline properties of the diodes 430). Lower resistivity diode material thereby is provided.

Alternative Exemplary Memory Cell

Figure 5:
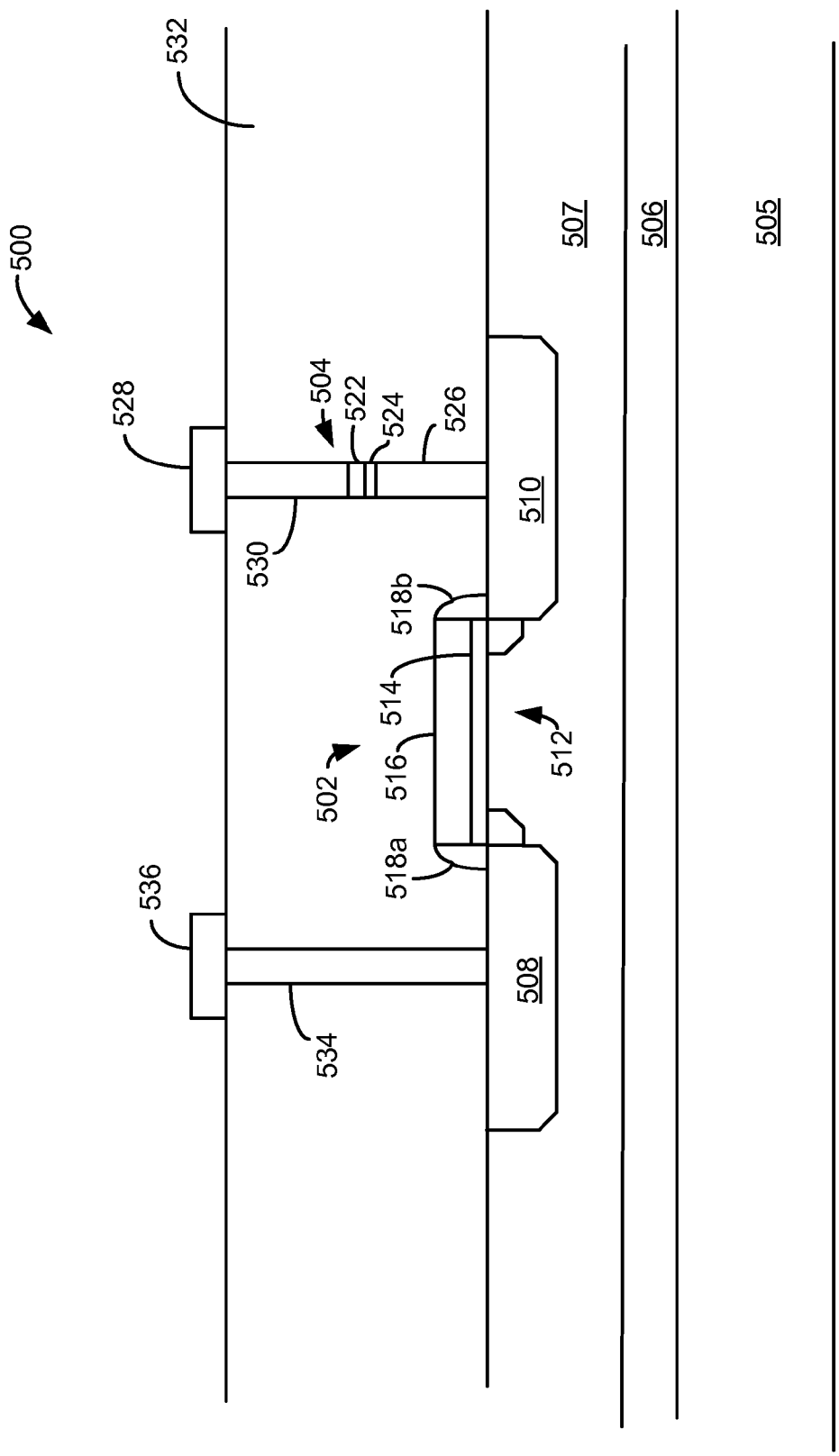
FIG. 5 is a cross sectional view of a first alternative memory cell provided in accordance with the present invention.

FIG. 5 is a cross sectional view of an exemplary memory cell 500 provided in accordance with the present invention. The memory cell 500 includes a thin film transistor (TFT), such as a thin film, metal oxide semiconductor field effect transistor (MOSFET) 502 coupled to a reversible resistance-switching element 504 formed above a substrate 505. For example, the MOSFET 502 may be an n-channel or a p-channel thin film MOSFET formed on any suitable substrate. In the embodiment shown, an insulating region 506 such as silicon dioxide, silicon nitride, oxynitride, etc., is formed above the substrate 505 and a deposited semiconductor region 507 such as deposited silicon, germanium, silicon-germanium, etc., is formed above the insulating region 506. The thin film MOSFET 502 is formed within the deposited semiconductor region 507 and is insulated from the substrate 505 by the insulating region 506.

The MOSFET 502 includes source/drain regions 508, 510 and channel region 512, as well as gate dielectric layer 514, gate electrode 516 and spacers 518a-b. In at least one embodiment, the source/drain regions 508, 510 may be doped p-type and the channel region 512 may be doped n-type, while in other embodiments the source/drain regions 508, 510 may be doped n-type and the channel region 512 may be doped p-type. Any other MOSFET configuration or any suitable fabrication techniques may be employed for the thin film MOSFET 502. In some embodiments, the MOSFET 502 may be electrically isolated by isolation regions (not shown) formed using an STI, LOCOS or other similar process. Alternatively, gate, source and/or drain regions of the MOSFET 502 may be shared with other transistors (not shown) formed on the substrate 505.

The reversible resistance-switching element 504 includes a reversible resistivity-switching CNT material 522 formed over a conductive plug 526. In at least one embodiment, the reversible resistivity-switching CNT material 522 is formed using a selective formation process as previously described with reference to the embodiments of FIGS. 1-4D. For example, a CNT seeding layer 524 such as titanium or tantalum nitride and/or a metal catalyst such as nickel, cobalt, iron, etc., may be formed over the conductive plug 526. The CNT material 522 then may be selectively formed over the CNT seeding layer 524 as previously described.

As shown in FIG. 5, the reversible resistance-switching element 504 is coupled to the source/drain region 510 of the MOSFET 502 by the first conductive plug 526 and to a first metal level (M1) line 528 by a second conductive plug 530 (which extend through a dielectric layer 532). Likewise, a third conductive plug 534 couples the source/drain region 508 of the MOSFET 502 to an M1 line 536. The conductive plugs and/or lines may be formed from any suitable materials (without or without barriers layers) such as tungsten, another metal, heavily doped semiconductor material, a conductive silicide, a conductive silicide-germanide, a conductive germanide, or the like. Note that when the MOSFET 502 is an n-channel device, the region 508 serves as the drain and the region 510 serves as the source for the MOSFET 502; and when the MOSFET 502 is an p-channel device, the region 508 serves as the source and the region 510 serves as the drain for the MOSFET 502. The dielectric layer 532 may include any suitable dielectric such as silicon dioxide, silicon nitride, silicon oxynitride, low K dielectrics, etc.

In the memory cell 500, the thin film MOSFET 502 operates as a steering element in a manner similar to that of the diodes employed in the memory cells of FIGS. 2A-4D, selectively limiting the voltage applied across and/or the current flow through the reversible resistance-switching element 504.

The foregoing description discloses only exemplary embodiments of the invention. Modifications of the above disclosed apparatus and methods which fall within the scope of the invention will be readily apparent to those of ordinary skill in the art.

Accordingly, while the present invention has been disclosed in connection with exemplary embodiments thereof, it should be understood that other embodiments may fall within the spirit and scope of the invention, as defined by the following claims.

The invention claimed is:

1. A method of fabricating a memory cell, the method comprising:
   fabricating a steering element above a substrate; and
   fabricating a reversible-resistance switching element coupled to the steering element by selectively fabricating carbon nano-tube (CNT) material above the substrate by:
   fabricating a CNT seeding layer by:
      depositing titanium nitride; and
      roughening a surface of the deposited titanium nitride;
   patterning and etching the CNT seeding layer; and
   selectively fabricating CNT material on the CNT seeding layer.

2. The method of claim 1, further comprising selectively depositing a metal layer on the roughened titanium nitride surface.

3. The method of claim 2 wherein the metal layer comprises nickel, cobalt or iron.

4. The method of claim 1, wherein patterning and etching the CNT seeding layer includes patterning and etching the steering element.

5. The method of claim 1, wherein selectively fabricating CNT material on the CNT seeding layer includes depositing CNT material on the CNT seeding layer using chemical vapor deposition (CVD) or plasma-enhanced CVD.

6. The method of claim 1 wherein the reversible-resistance switching element is fabricated above the steering element.

7. The method of claim 1 wherein fabricating the steering element comprises fabricating a p-n or p-i-n diode.

8. The method of claim 7 wherein fabricating the steering element comprises fabricating a polycrystalline diode.

9. The method of claim 8 wherein fabricating the steering element comprises fabricating a vertical polycrystalline diode.

10. The method of claim 9 wherein fabricating the steering element comprises fabricating a vertical polycrystalline diode having polycrystalline material that is in a low-resistivity state.

11. A memory cell formed using the method of claim 9.

12. The method of claim 1 wherein fabricating the steering element comprises fabricating a thin film transistor.

13. The method of claim 12 wherein fabricating the steering element comprises fabricating a thin film, metal oxide semiconductor field effect transistor (MOSFET).

14. A memory cell formed using the method of claim 1.

15. A method of fabricating a memory cell comprising:
   fabricating a steering element above a substrate; and
   fabricating a reversible-resistance switching element coupled to the steering element by selectively fabricating carbon nano-tube (CNT) material above the substrate by:
   fabricating a CNT seeding layer by:
      depositing titanium nitride above a first conductor; and
      selectively depositing a metal catalyst layer on the titanium nitride;
   patterning and etching the CNT seeding layer; and
   selectively fabricating CNT material on the CNT seeding layer.

16. The method of claim 15 wherein the metal layer comprises nickel, cobalt or iron.

17. A method of fabricating a memory cell, the method comprising:
   fabricating a steering element above a substrate;
   fabricating a reversible-resistance switching element coupled to the steering element by selectively fabricating carbon nano-tube (CNT) material above the substrate by:
   fabricating a CNT seeding layer;
   patterning and etching the CNT seeding layer; and
   selectively fabricating CNT material on the CNT seeding layer; and
   creating defects in the CNT material so as to tune switching characteristics of the CNT material.

18. A method of fabricating a memory cell, the method comprising:
   fabricating a first conductor above a substrate;
   fabricating a reversible-resistance switching element above the first conductor by selectively fabricating carbon nano-tube (CNT) material above the first conductor by:
   fabricating a CNT seeding layer by:
      depositing titanium nitride; and
      roughening a surface of the deposited titanium nitride;
   patterning and etching the CNT seeding layer; and
   selectively fabricating CNT material on the CNT seeding layer;
   fabricating a diode above the first conductor; and
   fabricating a second conductor above the diode and the reversible resistance-switching element.

19. The method of claim 18, further comprising selectively depositing a metal layer on the roughened titanium nitride surface.

20. The method of claim 18, wherein patterning and etching the CNT seeding layer includes patterning and etching the diode.

21. The method of claim 18 wherein the reversible-resistance switching element is fabricated above the diode.

22. The method of claim 18 wherein fabricating the diode comprises fabricating a vertical polycrystalline diode.

23. The method of claim 22 further comprising fabricating a silicide, silicide-germanide or germanide region in contact with polycrystalline material of the vertical polycrystalline diode so that the polycrystalline material is in a low-resistivity state.

24. A memory cell formed using the method of claim 23.

25. A memory cell formed using the method of claim 18.

26. A method of fabricating a memory cell, the method comprising:
fabricating a first conductor above a substrate;
fabricating a vertical polycrystalline diode above the first conductor;
fabricating a reversible-resistance switching element above the vertical polycrystalline diode by selectively fabricating carbon nano-tube (CNT) material above the vertical polycrystalline diode by:
fabricating a CNT seeding layer by:
depositing titanium nitride; and
roughening a surface of the deposited titanium nitride;
patterning and etching the CNT seeding layer; and
selectively fabricating CNT material on the CNT seeding layer; and
fabricating a second conductor above the reversible-resistance switching element.

27. The method of claim 26, further comprising selectively depositing a metal layer on the roughened titanium nitride surface.

28. The method of claim 26, wherein patterning and etching the CNT seeding layer includes patterning and etching the diode.

29. The method of claim 26 further comprising fabricating a silicide, silicide-germanide or germanide region in contact with polycrystalline material of the vertical polycrystalline diode so that the polycrystalline material is in a low-resistivity state.

30. A memory cell formed using the method of claim 26.

31. A method of fabricating a memory cell, the method comprising:
fabricating a thin film transistor having a source region and a drain region;
fabricating a first conductor coupled to the source region or the drain region of the transistor;
fabricating a reversible-resistance switching element coupled to the first conductor by selectively fabricating carbon nano-tube (CNT) material above the first conductor by:
fabricating a CNT seeding layer by:
depositing titanium nitride; and
roughening a surface of the deposited titanium nitride;
patterning and etching the CNT seeding layer; and
selectively fabricating CNT material on the CNT seeding layer; and
fabricating a second conductor above the reversible resistance-switching element.

32. A memory cell formed using the method of claim 31.

33. A method of fabricating a memory cell, the method comprising:
fabricating a steering element above a substrate; and
fabricating a reversible-resistance switching element coupled to the steering element by selectively fabricating carbon nano-tube (CNT) material above the substrate by fabricating CNT material having CNTs that are substantially vertically aligned so as to reduce lateral conduction in the CNT material.

34. A method of fabricating a memory cell, the method comprising:
fabricating a first conductor above a substrate; and
fabricating a reversible-resistance switching element above the first conductor by selectively fabricating carbon nano-tube (CNT) material above the first conductor by fabricating CNT material having CNTs that are substantially vertically aligned so as to reduce lateral conduction in the CNT material.

35. A method of fabricating a memory cell, the method comprising:
fabricating a first conductor above a substrate;
fabricating a vertical polycrystalline diode above the first conductor; and
fabricating a reversible-resistance switching element above the vertical polycrystalline diode by selectively fabricating carbon nano-tube (CNT) material above the vertical polycrystalline diode by fabricating CNT material having CNTs that are substantially vertically aligned so as to reduce lateral conduction in the CNT material.

36. A memory cell comprising:
a steering element;
a reversible resistance-switching element coupled to the steering element and including selectively fabricated carbon nano-tube (CNT) material; and
a patterned and etched CNT seeding layer on which the CNT material is selectively fabricated,
wherein the CNT seeding layer comprises a conducting layer including titanium nitride that is surface roughened.

37. The memory cell of claim 36 wherein the steering element comprises a p-n or p-i-n diode.

38. The memory cell of claim 37 wherein the diode comprises a vertical polycrystalline diode.

39. The memory cell of claim 38 wherein the vertical polycrystalline diode includes polycrystalline material that is in a low-resistivity state.

40. The memory cell of claim 36 wherein the steering element comprises a thin film transistor.

41. The memory cell of claim 40 wherein the thin film transistor comprises a metal oxide semiconductor field effect transistor (MOSFET).

42. The memory cell of claim 36, wherein the CNT seeding layer is patterned and etched with the steering element.

43. A memory cell comprising:
a steering element;
a reversible resistance-switching element coupled to the steering element and including selectively fabricated carbon nano-tube (CNT) material; and
a patterned and etched CNT seeding layer on which the CNT material is selectively fabricated, wherein the CNT material includes defects that tune the switching characteristics of the CNT material.

44. A memory cell comprising:
a first conductor;
a second conductor formed above the first conductor;
a diode formed between the first and second conductors;
a reversible resistance-switching element including carbon nano-tube (CNT) material selectively fabricated between the first and second conductors; and
a patterned and etched CNT seeding layer on which the CNT material is selectively fabricated,
wherein the CNT seeding layer comprises a conducting layer including titanium nitride that is surface roughened.

45. The memory cell of claim 44 wherein the diode comprises a vertical polycrystalline diode.

46. The memory cell of claim 45 wherein the reversible resistance-switching element is above the vertical polycrystalline diode.

47. The memory cell of claim 45 further comprising a silicide, silicide-germanide or germanide region in contact with polycrystalline material of the vertical polycrystalline diode so that the polycrystalline material is in a low-resistivity state.

48. A memory cell comprising:
a thin film transistor having a source region and a drain region;
a first conductor coupled to the source region or the drain region;
a reversible resistance-switching element including carbon nano-tube (CNT) material selectively fabricated above the first conductor, wherein the CNT seeding layer comprises a conducting layer including titanium nitride that is surface roughened; and
a second conductor formed above the reversible resistance-switching element.

49. The memory cell of claim 48 wherein the thin film transistor comprises an n-channel or a p-channel metal oxide semiconductor field effect transistor.

50. The memory cell of claim 48 further comprising a patterned and etched CNT seeding layer on which the CNT material is selectively fabricated.

51. A plurality of nonvolatile memory cells comprising:
a first plurality of substantially parallel, substantially coplanar conductors extending in a first direction;
a plurality of diodes;
a plurality of reversible resistance-switching elements; and
a second plurality of substantially parallel, substantially coplanar conductors extending in a second direction different from the first direction;
wherein, in each memory cell, one of the diodes and one of the reversible resistance-switching elements are arranged in series, disposed between one of the first conductors and one of the second conductors;
wherein each reversible resistance-switching element includes selectively fabricated carbon nano-tube (CNT) material;
wherein each reversible resistance-switching element includes a patterned and etched CNT seeding layer on which the CNT material of the reversible resistance-switching element is selectively fabricated;
wherein the CNT seeding layer of each reversible resistance-switching element comprises a conducting layer;
wherein the conducting layer of each reversible resistance-switching element comprises titanium nitride; and
wherein the titanium nitride of each reversible resistance-switching element is surface roughened.

52. The plurality of nonvolatile memory cells of claim 51 wherein each diode is a vertical polycrystalline diode.

53. The plurality of nonvolatile memory cells of claim 52 further comprising a silicide, silicide-germanide or germanide region in contact with polycrystalline material of each vertical polycrystalline diode so that the polycrystalline material is in a low-resistivity state.

54. A monolithic three dimensional memory array comprising:
a first memory level formed above a substrate, the first memory level comprising:
a plurality of memory cells, wherein each memory cell of the first memory level comprises:
a steering element; and
a reversible resistance-switching element coupled to the steering element and including a selectively fabricated carbon nano-tube (CNT) material, wherein the CNT material of each reversible resistance-switching element includes CNTs that are substantially vertically aligned so as to reduce lateral conduction in the CNT material; and
at least a second memory level monolithically formed above the first memory level.

55. The monolithic three dimensional memory array of claim 54 wherein each steering element comprises a vertical polycrystalline diode.

56. The monolithic three dimensional memory array of claim 55 wherein each vertical polycrystalline diode comprises a vertical polysilicon diode.

57. The monolithic three dimensional memory array of claim 54 wherein each reversible resistance-switching element includes a patterned and etched CNT seeding layer on which the CNT material of the reversible resistance-switching element is selectively fabricated.

58. A memory cell comprising:
a steering element; and
a reversible resistance-switching element coupled to the steering element and including selectively fabricated carbon nano-tube (CNT) material,
wherein the CNT material includes CNTs that are substantially vertically aligned so as to reduce lateral conduction in the CNT material.

59. A memory cell comprising:
a first conductor;
a second conductor formed above the first conductor;
a diode formed between the first and second conductors; and
a reversible resistance-switching element including carbon nano-tube (CNT) material selectively fabricated between the first and second conductors,
wherein the CNT material includes CNTs that are substantially vertically aligned so as to reduce lateral conduction in the CNT material.

60. A memory cell comprising:
a thin film transistor having a source region and a drain region;
a first conductor coupled to the source region or the drain region; and
a reversible resistance-switching element including carbon nano-tube (CNT) material selectively fabricated above the first conductor,
wherein the CNT material includes CNTs that are substantially vertically aligned so as to reduce lateral conduction in the CNT material.

61. A plurality of nonvolatile memory cells comprising:
- a first plurality of substantially parallel, substantially coplanar conductors extending in a first direction;
- a plurality of diodes;
- a plurality of reversible resistance-switching elements; and
- a second plurality of substantially parallel, substantially coplanar conductors extending in a second direction different from the first direction;
- wherein, in each memory cell, one of the diodes and one of the reversible resistance-switching elements are arranged in series, disposed between one of the first conductors and one of the second conductors;
- wherein each reversible resistance-switching element includes selectively fabricated carbon nano-tube (CNT) material; and
- wherein the CNT material of each reversible resistance-switching element includes CNTs that are substantially vertically aligned so as to reduce lateral conduction in the CNT material.

* * * * *